US012626736B2

(12) United States Patent
Son et al.

(10) Patent No.: US 12,626,736 B2
(45) Date of Patent: May 12, 2026

(54) SEMICONDUCTOR DEVICE

(71) Applicant: SAMSUNG ELECTRONICS CO., LTD., Suwon-si (KR)

(72) Inventors: Woohyun Son, Suwon-si (KR); Jungwoo Jang, Suwon-si (KR); Mincheol Kwak, Suwon-si (KR); Taehong Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 153 days.

(21) Appl. No.: 18/750,232

(22) Filed: Jun. 21, 2024

(65) Prior Publication Data

US 2025/0210076 A1      Jun. 26, 2025

(30) Foreign Application Priority Data

Dec. 26, 2023     (KR) ........................ 10-2023-0190870

(51) Int. Cl.
*G11C 7/10* (2006.01)
*H01L 25/065* (2023.01)
(Continued)

(52) U.S. Cl.
CPC ........ *G11C 7/1048* (2013.01); *H01L 25/0657* (2013.01); *H01L 25/18* (2013.01);
(Continued)

(58) Field of Classification Search
CPC .......... G11C 7/1048; G11C 2207/2245; G11C 16/26; G11C 5/06; G11C 7/1051; G11C 7/1078; G11C 29/42; G11C 29/52; H01L 25/0657; H01L 25/18; H01L 2225/06541; H01L 2225/06513; H01L 23/481; H01L 2225/06548; H10B 80/00
(Continued)

(56) References Cited

U.S. PATENT DOCUMENTS 8,063,654 B2 * 11/2011 Rahman ......... G01R 31/318544
324/762.06
9,300,298 B2 3/2016 Cordero et al.
(Continued)

FOREIGN PATENT DOCUMENTS

JP 2021-190829 A 12/2021

*Primary Examiner* — Michael T Tran
(74) *Attorney, Agent, or Firm* — Sughrue Mion, PLLC

(57) ABSTRACT

A semiconductor device includes a first semiconductor die including a first interface circuit; and a second semiconductor die stacked with the first semiconductor die and including a second interface circuit connected to the first semiconductor die by a plurality of via structures, wherein the first interface circuit is configured to generate an error detection code for transmission data and transmit the data signal including the transmission data and the error detection code to the second interface circuit through at least some of the plurality of via structures, and the second interface circuit is configured to generate response data indicating whether the data signal is normally received and an error correction code of the response data, and transmit a response signal including the response data and the error correction code to the first interface circuit through at least one via structure among the plurality of via structures.

20 Claims, 16 Drawing Sheets

(51) Int. Cl.
    *H01L 25/18*         (2023.01)
    *H10B 80/00*       (2023.01)

(52) U.S. Cl.
    CPC ..... *H10B 80/00* (2023.02); *G11C 2207/2245*
            (2013.01); *H01L 2225/06541* (2013.01)

(58) Field of Classification Search
    USPC ........................................ 365/189.18, 189.09
    See application file for complete search history.

(56)                 References Cited

U.S. PATENT DOCUMENTS

| | | | |
|---|---|---|---|
| 10,762,007 | B2 | 9/2020 | Yang |
| 11,636,885 | B2 | 4/2023 | Kwon et al. |
| 2011/0087813 | A1* | 4/2011 | Clark .................. G06F 13/4256 |
| | | | 710/105 |
| 2011/0211414 | A1* | 9/2011 | Musha ..................... G11C 5/02 |
| | | | 365/230.03 |
| 2012/0266041 | A1* | 10/2012 | Wang ................... G11C 29/848 |
| | | | 714/752 |
| 2014/0091834 | A1 | 4/2014 | Chi |
| 2014/0157067 | A1* | 6/2014 | Yang ............... G11C 29/56012 |
| | | | 714/728 |
| 2015/0019803 | A1* | 1/2015 | Miller .................. G06F 3/0611 |
| | | | 711/125 |
| 2018/0068742 | A1* | 3/2018 | Sohn ..................... G11C 29/42 |
| 2020/0285537 | A1 | 9/2020 | Choi et al. |
| 2022/0208294 | A1* | 6/2022 | Lee ................. G11C 29/12005 |
| 2022/0309012 | A1 | 9/2022 | Vankayala |
| 2022/0405190 | A1* | 12/2022 | Lee ....................... G06F 11/368 |
| 2023/0121992 | A1 | 4/2023 | Kim et al. |

* cited by examiner

10

SEMICONDUCTOR DEVICE

CROSS-REFERENCE TO RELATED APPLICATION(S)

This application claims benefit of priority to Korean Patent Application No. 10-2023-0190870 filed on Dec. 26, 2023 in the Korean Intellectual Property Office, the disclosure of which is incorporated herein by reference in its entirety.

BACKGROUND

One or more example embodiments of the disclosure relate to a semiconductor device.

Semiconductor devices may include various circuits to perform operations. In order to improve the performance of semiconductor devices and reduce power consumption, three-dimensional (3D) semiconductor devices in which circuits are distributed across a plurality of semiconductor dies and the plurality of semiconductor dies are stacked have been proposed. In a 3D semiconductor device, at least some of the circuits included in different semiconductor dies may be connected to each other through via structures to exchange data signals, clock signals, and the like. Therefore, in order to improve the reliability and integration of 3D semiconductor devices, it is needed to improve a data transfer rate through via structures and appropriately limit a number of via structures.

SUMMARY

One or more example embodiments of the disclosure provide a semiconductor device having improved reliability of communication between semiconductor dies connected by via structures and stacked on each other.

According to an aspect of an example embodiment of the disclosure, a semiconductor device may include: a first semiconductor die including a first interface circuit configured to output a data signal and a transmission clock signal, wherein the first interface circuit includes a cyclic redundancy check (CRC) encoder configured to generate CRC data of transmission data included in the data signal and a buffer memory configured to store the transmission data, a second semiconductor die including a second interface circuit configured to receive the data signal and the transmission clock signal, wherein the second interface circuit includes a CRC decoder configured to decode the CRC data included in the data signal, a response controller configured to generate response data based on the CRC data, the response data indicating completion of transmission of the transmission data or requesting retransmission of the transmission data, and an error correcting code (ECC) encoder configured to generate ECC data of the response data; and a plurality of via structures connecting the first interface circuit to the second interface circuit, wherein the first interface circuit further includes an ECC decoder configured to recover the response data by decoding the ECC data of the response data, and based on the response data, retransmit the transmission data stored in the buffer memory or transmit new transmission data.

According to an aspect of an example embodiment of the disclosure, a semiconductor device may include: a first semiconductor die including a first interface circuit; and a second semiconductor die stacked with the first semiconductor die and including a second interface circuit, the second interface circuit being connected to the first semiconductor die by a plurality of via structures, wherein the first interface circuit is configured to generate an error detection code for transmission data and transmit a data signal including the transmission data and the error detection code to the second interface circuit through at least some of the plurality of via structures, and wherein the second interface circuit is configured to generate response data, indicating whether the data signal is normally received, and an error correction code of the response data, and transmit a response signal including the response data and the error correction code to the first interface circuit through at least one via structure among the plurality of via structures.

According to an aspect of an example embodiment of the disclosure, a semiconductor device may include: a first semiconductor die including a first interface circuit; and a second semiconductor die including a second interface circuit connected to the first interface circuit by a plurality of via structures, the second semiconductor die being stacked with the first semiconductor die, wherein the first interface circuit includes a plurality of data transmission circuits connected to data via structures among the plurality of via structures and a first-in-first-out (FIFO) circuit commonly connected to the plurality of data transmission circuits, and wherein each of the plurality of data transmission circuits includes a latch and at least one flipflop, each being configured to receive transmission data output from the FIFO circuit, and a multiplexer connected between the latch and the at least one flipflop and a corresponding data via structure among the data via structures.

BRIEF DESCRIPTION OF DRAWINGS

The above and other aspects, features, and advantages of certain example embodiments of the disclosure will be more clearly understood from the following detailed description, taken in conjunction with the accompanying drawings, in which.

DETAILED DESCRIPTION

Hereinafter, example embodiments of the disclosure are described with reference to the accompanying drawings.

Figure 1:
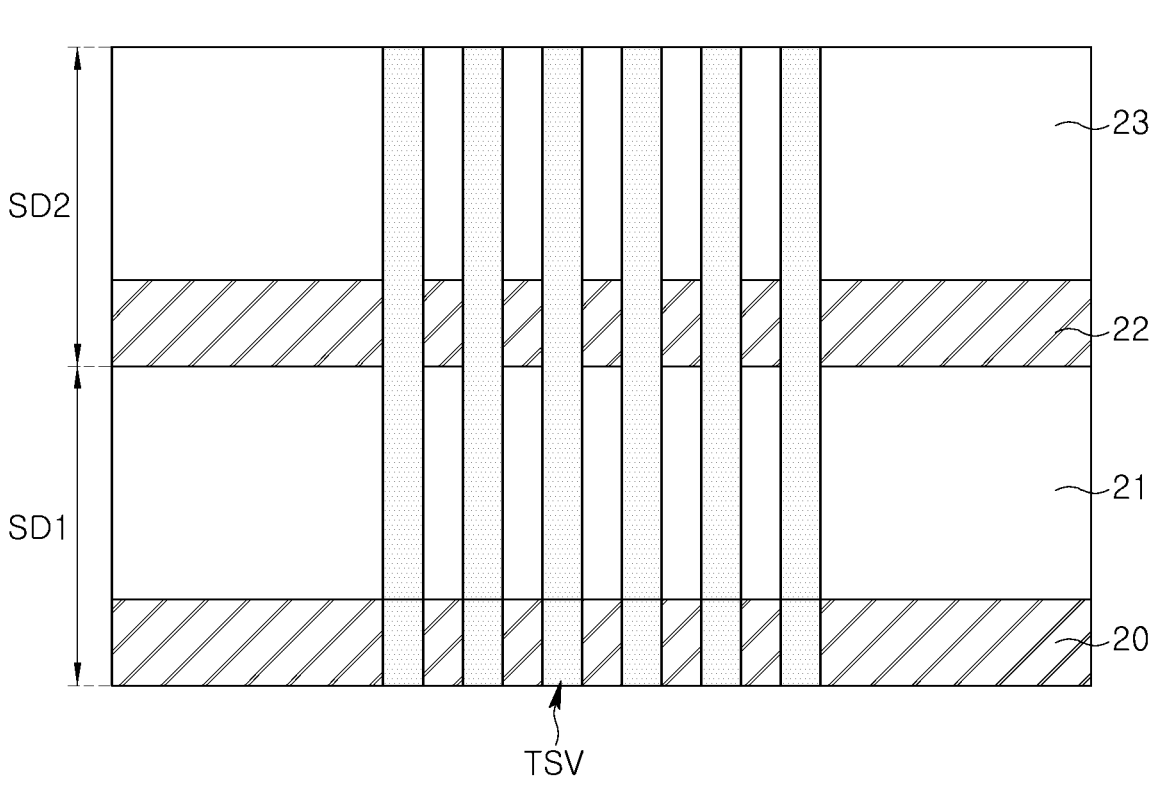
FIG. 1 is a diagram schematically illustrating a semiconductor device according to one or more example embodiments of the disclosure.

FIG. 1 is a diagram schematically illustrating a semiconductor device according to one or more example embodiments of the disclosure.

Referring to FIG. 1, a semiconductor device 10 according to one or more example embodiments of the disclosure may include a first semiconductor die SD1 and a second semiconductor die SD2 that are stacked on each other. However, according to one or more example embodiments, a number of semiconductor dies included in the semiconductor device 10 and stacked on each other may be three or more.

The first semiconductor die SD1 and the second semiconductor die SD2 may respectively include front end of line (FEOL) regions 20 and 22 and back end of line (BEOL) regions 21 and 23, and the like. The FEOL regions 20 and 22 may include a semiconductor substrate and elements provided on the semiconductor substrate. The devices may include an active region provided by implanting impurities into a semiconductor substrate, a gate structure provided on an upper surface of the semiconductor substrate or partially embedded in the semiconductor substrate, and a contact connected to the active region and the gate structure.

The BEOL regions 21 and 23 may include a plurality of interconnection patterns and a plurality of vias connected to devices provided in the FEOL regions 20 and 22. Circuits that provide various functions may be implemented by connecting elements included in the FEOL regions 20 and 22 to each other by using the plurality of interconnection patterns and the plurality of vias included in the BEOL regions 21 and 23. The plurality of interconnection patterns and the plurality of vias may be provided in an interlayer insulating layer that includes an insulating material.

Referring to FIG. 1, the first semiconductor die SD1 and the second semiconductor die SD2 may be connected to each other by a plurality of via structures TSV. For example, each of the plurality of via structures TSV may be formed as a through-silicon via penetrating through the semiconductor substrate included in at least one of the FEOL regions 20 and 22. Each of the plurality of via structures TSV may provide a data signal transmission path, a clock signal transmission path, and the like between the first semiconductor die SD1 and the second semiconductor die SD2.

In an embodiment, the first semiconductor die SD1 and the second semiconductor die SD2 may be implemented as chips that perform different functions. For example, the first semiconductor die SD1 may be a processor chip capable of performing various operations, and the second semiconductor die SD2 may be a memory chip capable of storing data transmitted from the first semiconductor die SD1 and/or reading stored data in response to a command from the first semiconductor die SD1 and providing the read data to the first semiconductor die SD1. In this manner, a single system may be implemented with the semiconductor device 10 by stacking the plurality of semiconductor dies SD1 and SD2, which are implemented as chips capable of performing different functions, and connecting the plurality of semiconductor dies SD1 and SD2 with the plurality of via structures TSV.

In order to exchange data signals and clock signals between the first semiconductor die SD1 and the second semiconductor die SD2 through the plurality of via structures TSV, each of the first semiconductor die SD1 and the second semiconductor die SD2 may include an interface circuit. The interface circuit may include a transmission circuit and a reception circuit, and in an embodiment, each of the transmission circuit and the reception circuit may be implemented as a digital circuit without an analog circuit. By implementing the transmission and reception circuits only with digital circuits, such as a flipflop, a latch, and a first-in-first-out (FIFO) circuit without analog circuits, power consumption of the semiconductor device 10 may be reduced.

Figure 2:
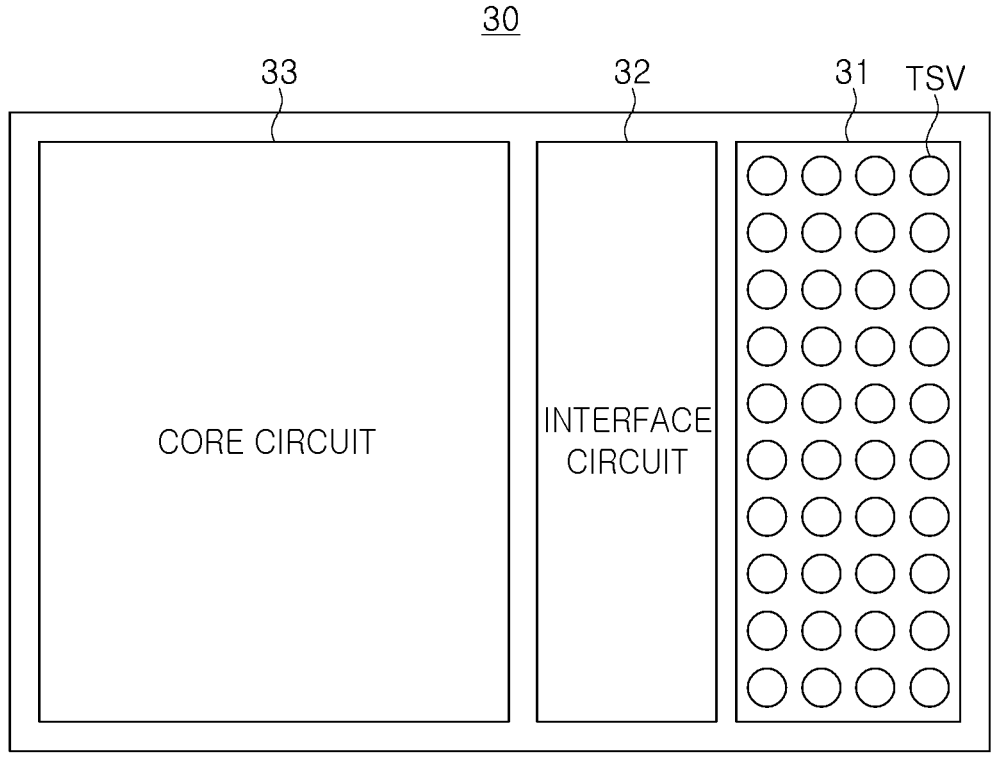
FIGS. 2 and 3 are diagrams schematically illustrating semiconductor dies included in a semiconductor device according to example embodiments of the disclosure.
Figure 3:
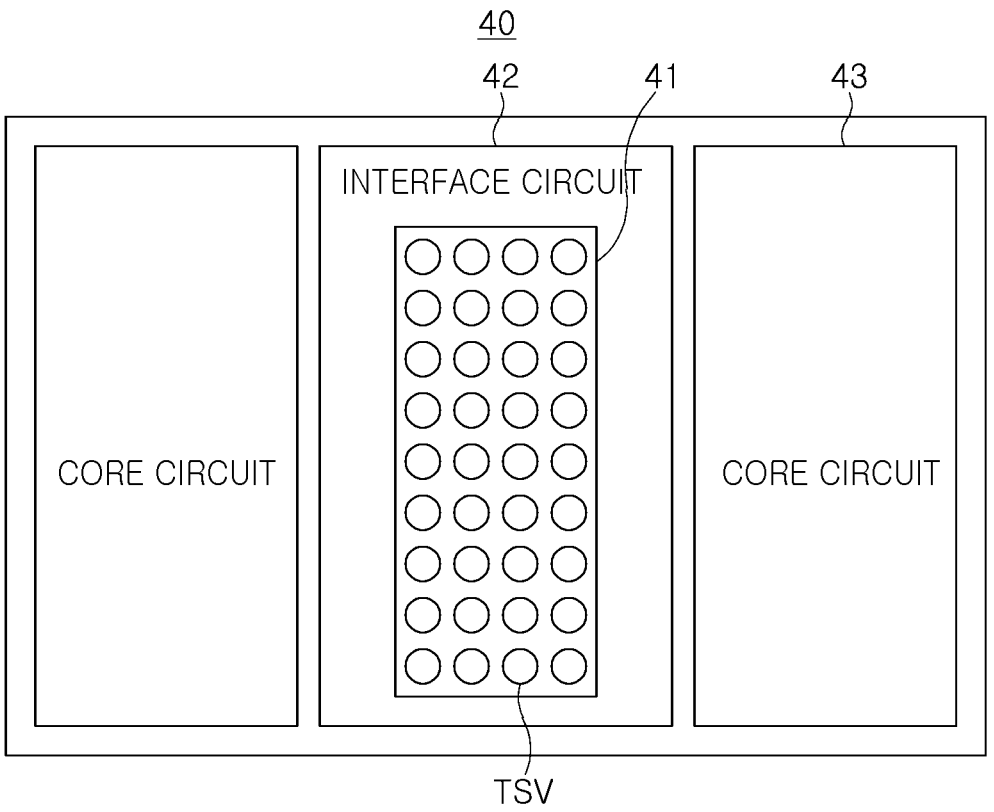

FIGS. 2 and 3 are diagrams schematically illustrating semiconductor dies included in a semiconductor device according to example embodiments of the disclosure.

Referring to FIG. 2, a semiconductor die 30 may include a via region 31, an interface circuit 32, a core circuit 33, and the like. A plurality of via structures TSVs may be provided in the via region 31, and the interface circuit 32 may be disposed close to the via region 31. A transmission circuit, a reception circuit, and the like configured to output and/or receive data signals and clock signals through the plurality of via structures TSV may be provided in the interface circuit 32.

As illustrated in FIG. 2, the interface circuit 32 may be disposed between the core circuit 33 and the via region 31. In this manner, the interface circuit 32 in which the transmission circuit and/or the reception circuit are disposed may be provided adjacent (e.g., as close as possible) to the plurality of via structures TSV, signal distortion and power consumption may be reduced.

Various circuits that are used to perform functions of the semiconductor die 30 may be disposed in the core circuit 33. For example, when the semiconductor die 30 is a memory chip, a memory bank or a memory block in which a plurality of memory cells are provided, and/or a decoder circuit, a page buffer, a sense amplifier, and the like to execute control operations, such as program, read, and/or delete, for at least some of the plurality of memory cells may be provided in the core circuit 33.

Referring to FIG. 3, a semiconductor die 40 may include a via region 41, an interface circuit 42, a core circuit 43, and the like. In the embodiment illustrated in FIG. 3, the interface circuit 42 may be disposed around the via region 41 in which a plurality of via structures TSVs are provided, and the core circuit 43 may be disposed near the interface circuit 42. As described above with reference to FIGS. 2 and 3, the arrangement of the via regions 31 and 41, the interface circuits 32 and 42, and the core circuits 33 and 43 in the semiconductor dies 30 and 40 may vary according to embodiments.

Figure 4:
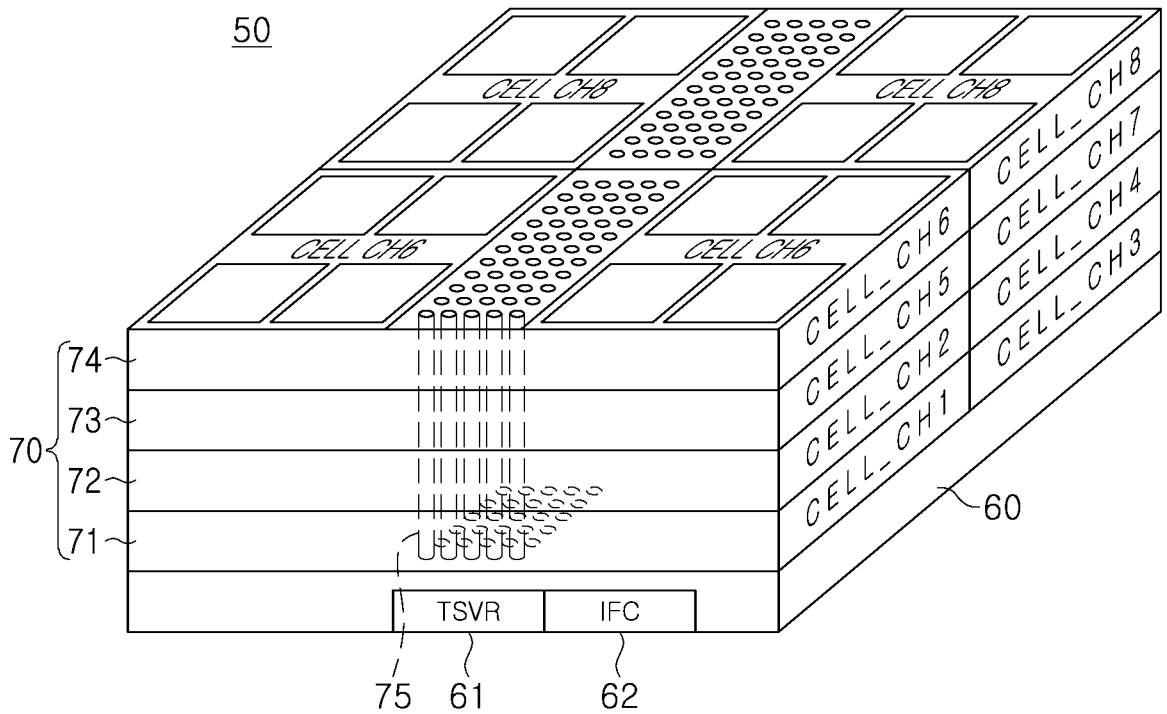
FIG. 4 is a diagram schematically illustrating a semiconductor device according to one or more example embodiments of the disclosure.

FIG. 4 is a diagram schematically illustrating a semiconductor device according to one or more example embodiments of the disclosure.

A semiconductor device 50 according to an embodiment illustrated in FIG. 4 may include a first semiconductor die 60 and a plurality of second semiconductor dies 71 to 74 (collectively, 70) that are stacked on each other. In an embodiment, the plurality of second semiconductor dies 70 may be respectively implemented as memory chips capable of storing data, and the first semiconductor die 60 may be implemented as a processor chip including a memory controller capable of controlling the memory chips. According to embodiments, some of the plurality of second semiconductor dies 70 may be implemented as different types of memory chips, or at least one of the second semiconductor dies 70 may be implemented as a processor chip.

The first semiconductor die 60 may be an application processor including a memory controller, a central processing unit, and the like, and may be communicatively connected to other devices. The first semiconductor die 60 may generate command signals, address signals, clock signals, and data signals related to the operation of each of the second semiconductor dies 70 and transmit the generated signals to at least one of the plurality of second semiconductor dies 70 through a plurality of via structures 75. For example, each of the plurality of via structures 75 may be a through-silicon via penetrating through a semiconductor substrate.

In an embodiment, each of the plurality of second semiconductor dies 70 may include a plurality of memory banks in which a plurality of memory cells are arranged, and the plurality of memory banks may be divided into a plurality of channels. In the embodiment illustrated in FIG. 4, each of the second semiconductor dies 70 may include two channels. For example, the second semiconductor die 71 may include a first channel CH1 and a third channel CH3, the second semiconductor die 72 may include a second channel CH2 and a fourth channel CH4, the second semiconductor die 73 may include a fifth channel CH5 and a seventh channel CH7, and the second semiconductor die 74 may include a sixth channel CH6 and an eighth channel CH8. However, this is only an embodiment, and the function and configuration of the second semiconductor dies 70 may vary according to embodiments.

A plurality of via structures 75 may be arranged to correspond to a plurality of channels CH1 to CH8. The plurality of via structures 75 may penetrate through the plurality of second semiconductor dies 70, and each of the plurality of second semiconductor dies 70 may include an interface circuit connected to the plurality of via structures 75.

Referring to FIG. 4, the first semiconductor die 60 may include a via region 61 in which a plurality of via structures 75 are disposed, an interface circuit 62 disposed to be adjacent to the via region 61, and the like. A core circuit for implementing the function of the first semiconductor die 60 may be disposed in most of the region excluding the interface circuit 62.

Figure 5:
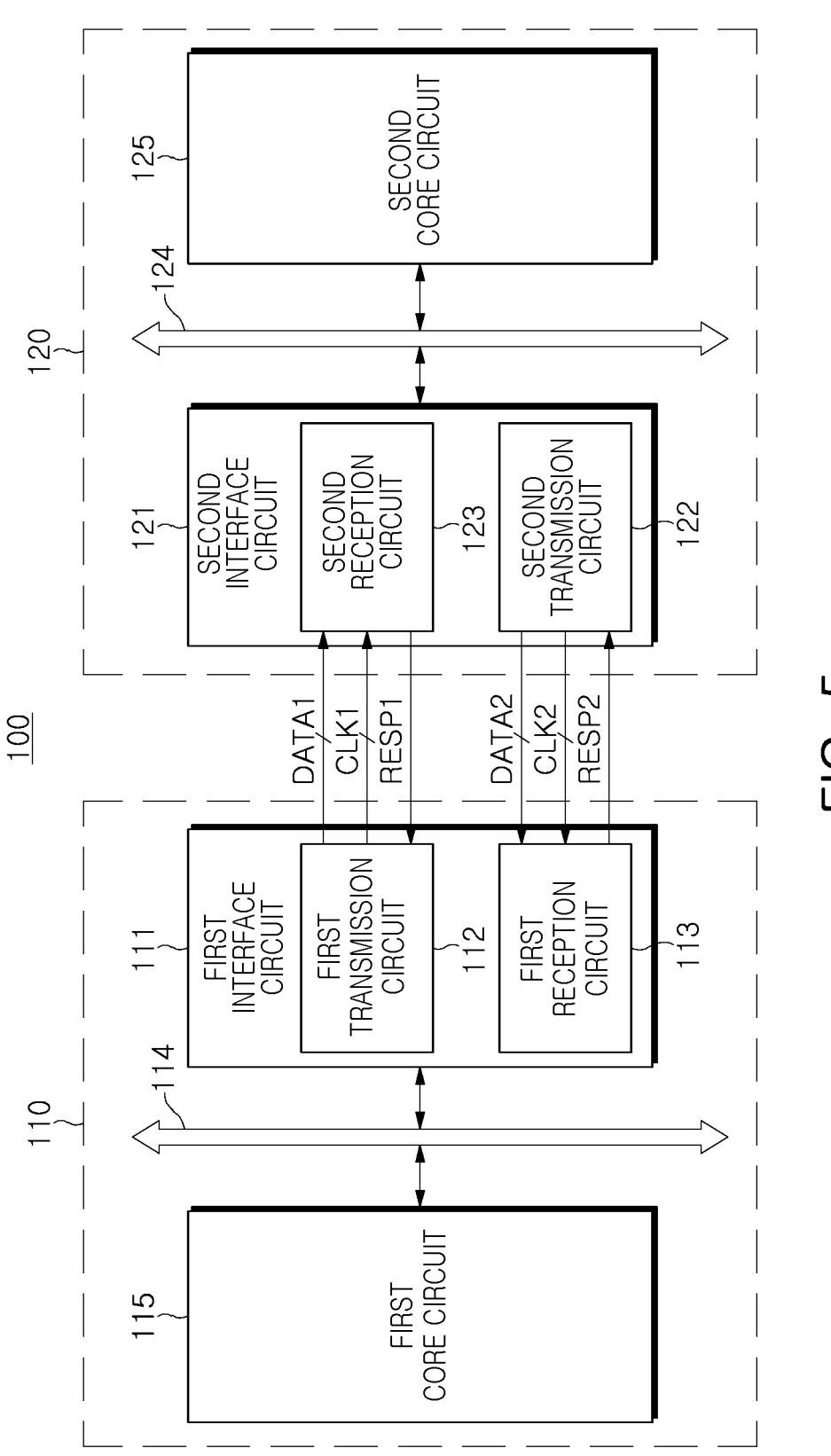
FIG. 5 is a diagram schematically illustrating a semiconductor device according to one or more example embodiments of the disclosure.

FIG. 5 is a simple block diagram of a semiconductor device according to one or more example embodiments of the disclosure.

Referring to FIG. 5, a semiconductor device 100 according to one or more example embodiments of the disclosure may include a first semiconductor die 110 and a second semiconductor die 120, and the first semiconductor die 110 and the second semiconductor die 120 may be connected to communicate with each other. For example, a signal transmission path between the first semiconductor die 110 and the second semiconductor die 120 may be provided by a plurality of via structures connecting the first semiconductor die 110 to the second semiconductor die 120.

The first semiconductor die 110 may include a first interface circuit 111, a first core circuit 115, and the like, and the first interface circuit 111 and the first core circuit 115 may be connected to each other through a first system bus

114. The first interface circuit 111 may include a first transmission circuit 112 and a first reception circuit 113. The first transmission circuit 112 may transmit a data signal DATA1 and a clock signal CLK1 to the second semiconductor die 120 and receive a response signal RESP1 from the second semiconductor die 120. The first reception circuit 113 may receive a data signal DATA2 and a clock signal CLK2 from the second semiconductor die 120 and transmit a response signal RESP2 to the second semiconductor die 120.

A configuration of the second semiconductor die 120 may be similar to that of the first semiconductor die 110. The second semiconductor die 120 may include a second interface circuit 121, a second system bus 124, a second core circuit 125, and the like, and the second interface circuit 121 may include a second transmission circuit 122 and a second reception circuit 123. The functions provided by the first semiconductor die 110 and the second semiconductor die 120 may be determined by the first core circuit 115 and the second core circuit 125, respectively.

The second transmission circuit 122 may transmit the data signal DATA2 and the clock signal CLK2 to the first semiconductor die 110 and receive the response signal RESP2 from the first semiconductor die 110. The second reception circuit 123 may receive the data signal DATA1 and the clock signal CLK1 from the first semiconductor die 110 and transmit the response signal RESP1 to the first semiconductor die 110. In the embodiment illustrated in FIG. 5, the semiconductor device 100 may operate in a source synchronous manner in which the clock signals CLK1 and CLK2 are transmitted along with the data signals DATA1 and DATA2 from a transmission side.

The response signals RESP1 and RESP2 are signals sent to the transmission side from the first reception circuit 113 and the second reception circuit 123, which have received the data signals DATA1 and DATA2. The response signals RSP1 and RSP2 may be signals indicating whether the data signals DATA1 and DATA2 have been normally received (or whether transmission of the data signals DATA1 and DATA2 has been successful). For example, the first transmission circuit 112 may generate the data signal DATA1 including transmission data to be transmitted to the second semiconductor die 120 and an error detection code of the transmission data. The second reception circuit 123 may determine whether the transmission data has been normally received using the error detection code included in the data signal DATA1, generate response data indicating the determination result, and transmit the response signal RESP1 including the response data to the first transmission circuit 112.

The first transmission circuit 112 may, based on the response signal RESP1, retransmit the data signal DATA1 or transmit a data signal to be transmitted next. Since the operation of the first transmission circuit 112 is determined according to the response signal RESP1, if an error occurs during the transmission of the response signal RESP1, the reliability of the semiconductor device 100 including the first semiconductor die 110 and the second semiconductor die 120 may deteriorate.

In one or more example embodiments of the disclosure, the second reception circuit 123 may generate the response signal RESP1 including an error correction code of the response data, together with the response data, and transmit the response signal RESP1 to the first transmission circuit 112. If needed, the first transmission circuit 112 may recover an error in the response data included in the response signal RESP1 using the error correction code. Therefore, the reliability of the response data included in the response signal RESP1 may be improved, and the first transmission circuit 112 may accurately determine whether to retransmit the data signal DATA1 based on the response signal RESP1. In an embodiment, the error detection code included in the data signal DATA1 may be cyclic redundancy check (CRC) data, and the error correction code included in the response signal RESP1 may be error correcting code (ECC) data.

Figure 6:
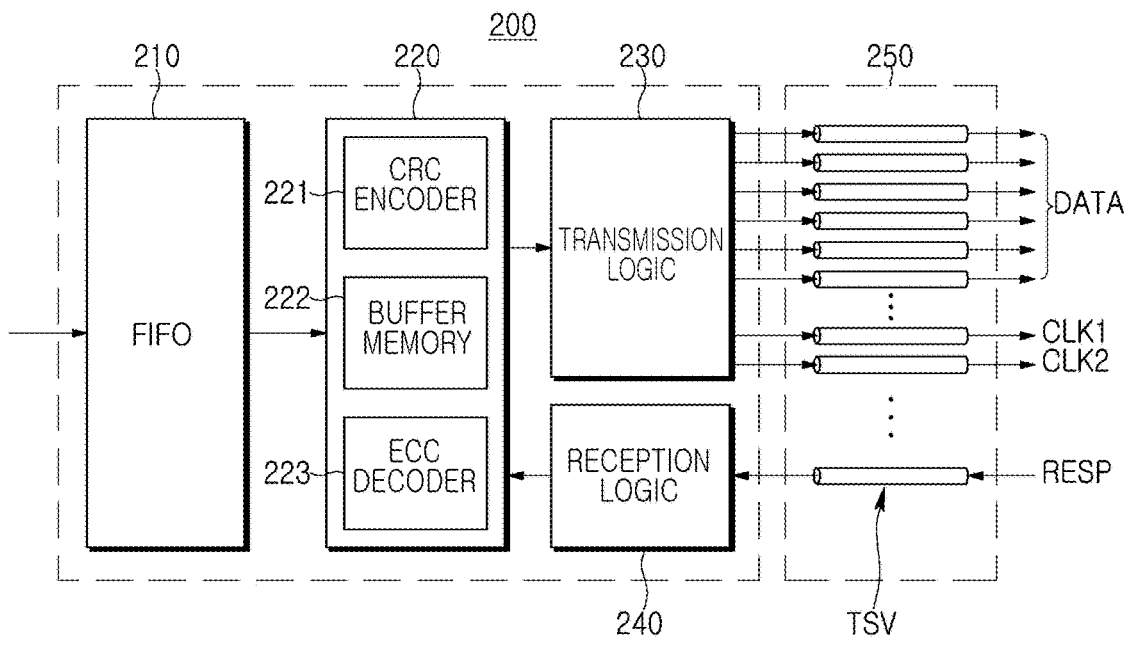
FIGS. 6 and 7 are diagrams schematically illustrating a semiconductor die included in a semiconductor device according to example embodiments of the disclosure.
Figure 7:
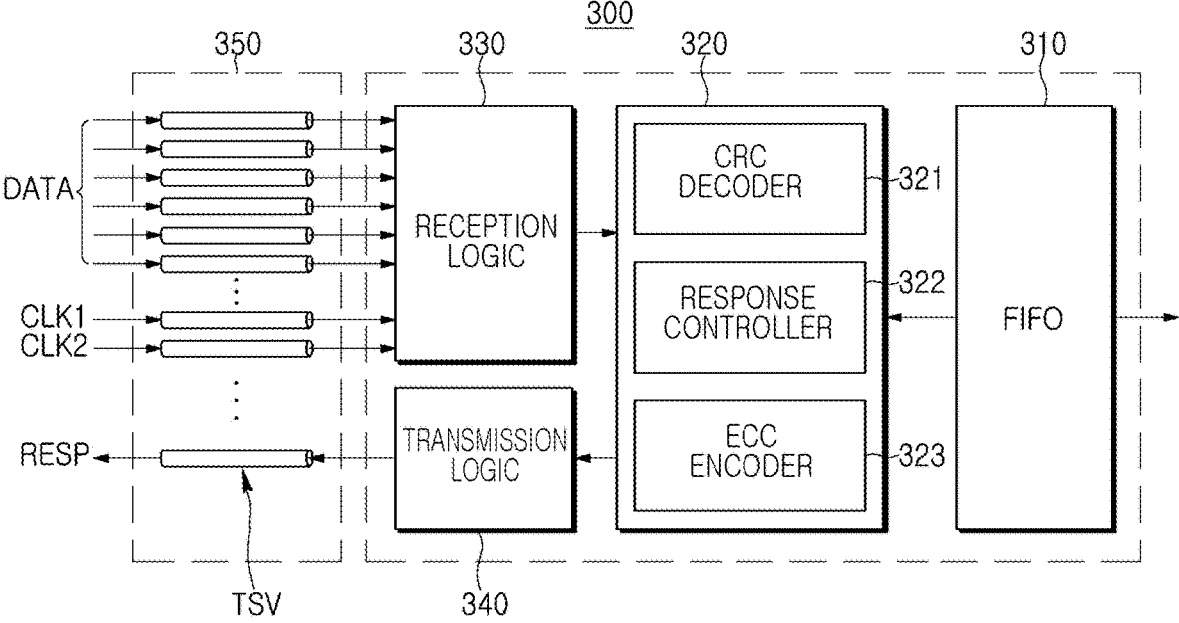

FIGS. 6 and 7 are diagrams schematically illustrating a semiconductor die included in a semiconductor device according to example embodiments of the disclosure.

FIG. 6 is a diagram schematically illustrating a semiconductor die 200 on a transmission side that transmits a signal and included in a semiconductor device according to one or more example embodiments of the disclosure, and FIG. 7 is a diagram illustrating a semiconductor die 300 on a reception side that receives a signal and included in a semiconductor device according to one or more example embodiments of the disclosure. Referring to FIG. 6, the semiconductor die 200 on the transmission side may include a FIFO circuit 210, an intermediate circuit 220, a transmission logic 230, and a reception logic 240. Data to be transmitted is temporarily stored in the FIFO circuit 210. For example, the core circuit may store data to be transmitted through a system bus in the FIFO circuit 210.

The FIFO circuit 210 may be a 1:N1 asynchronous FIFO circuit. For example, the FIFO circuit 210 may output stored data at a specific timing, and the intermediate circuit 220 may process data received from the FIFO circuit 210. For example, a CRC encoder 221 of the intermediate circuit 220 may CRC-encode data to be transmitted to generate CRC data of the data to be transmitted, and a buffer memory 222 may temporarily store the data to be transmitted. The transmission logic 230 may output a data signal DATA and clock signals CLK1 and CLK2 through a plurality of via structures TSV disposed in a via region 250. The data signal DATA includes the data to be transmitted and the CRC data of the data to be transmitted.

In an embodiment, the transmission logic 230 may output a first clock signal CLK1 and a second clock signal CLK2. The first clock signal CLK1 and the second clock signal CLK2 may have different frequencies. For example, a frequency of the first clock signal CLK1 may be twice a frequency of the second clock signal CLK2. The transmission logic 230 may include a frequency divider that generates the second clock signal CLK2 using the first clock signal CLK1. However, according to embodiments, the transmission logic 230 may output only one clock signal.

The reception logic 240 may receive the response signal RESP through at least one of the plurality of via structures TSV. The response signal RESP may be a signal transmitted by the semiconductor die 300 on the reception side, which receives the data signal DATA and the clock signals CLK1 and CLK2. The response signal RESP may include response data generated by the semiconductor die 300 on the reception side and ECC data generated by the semiconductor die 300 on the reception side by ECC-encoding the response data.

An ECC decoder 223 of the intermediate circuit 220 may recover the response data by decoding the ECC data included in the response signal RESP. The response data may include at least one of retry response data requesting retransmission of the data signal DATA and ready response data indicating that the data signal DATA has been normally received. Since the response data included in the response signal RESP may be accurately recovered using the ECC data, the semiconductor die 200 on the transmission side may perform a subsequent operation by referring to the response signal RESP received from the semiconductor die 300 on the reception side.

If the response data includes retry response data, the CRC encoder 221 of the intermediate circuit 220 may re-CRC-encode the data stored in the buffer memory 220, and the transmission logic 230 may output the data stored in the buffer memory 222 and the CRC data, obtained by the re-CRC-encoding, as a data signal DATA. If the response data includes ready response data, the buffer memory 222 of the intermediate circuit 220 may delete the stored data. Thereafter, new data received from the FIFO circuit 210 may be stored in the buffer memory 222 and may be CRC-encoded by the CRC encoder 221.

FIG. 7 is a diagram schematically illustrating the semiconductor die 300 on the reception side, which receives a data signal and a clock signal among the semiconductor dies included in a semiconductor device according to one or more example embodiments of the disclosure. Referring to FIG. 7, the semiconductor die 300 on the reception side may include a FIFO circuit 310, an intermediate circuit 320, a reception logic 330, and a transmission logic 340. The FIFO circuit 310 may temporarily store data received from the semiconductor die 200 on the transmission side and may transmit the received data to the core circuit through a system bus. The FIFO circuit 310 may be an N2:1 FIFO, and for example, N2 may be smaller than N1, which is a characteristic of the FIFO circuit 210 on the transmission side.

The reception logic 330 may receive the data signal DATA and the clock signals CLK1 and CLK2 through at least some of the plurality of via structures TSV arranged in the via a region 350. As described above, the first clock signal CLK1 and the second clock signal CLK2 may have different frequencies. The reception logic 330 may receive the data signal DATA with reference to at least one of the first clock signal CLK1 and the second clock signal CLK2.

The intermediate circuit 320 may include a CRC decoder 321, a response controller 322, and an ECC encoder 323. The CRC decoder 321 may decode the CRC data included in the data signal DATA and determine whether the data signal DATA has been received without an error. If it is determined that the data signal DATA has been received without an error, the response controller 322 may generate ready response data. If it is determined that an error occurred during the transmission of the data signal DATA, the response controller 322 may generate retry response data. The ECC encoder 323 may generate ECC data by ECC-encoding the ready response data or the retry response data.

The transmission logic 340 may output a response signal RESP including the response data generated by the response controller 322 and the ECC data generated by the ECC encoder 323. The response signal RESP may be transmitted to the semiconductor die 200 on the transmission side, and the semiconductor die 200 on the transmission side may retransmit data, which has been transmitted as the data signal DATA or transmit a data signal DATA including new data, based on the response data included in the response signal RESP.

An error may also occur during the transmission of the response signal RESP from the semiconductor die 300 on the reception side to the semiconductor die 200 on the transmission side. In one or more example embodiments of the disclosure, the ECC data obtained by ECC-encoding the response data by the semiconductor die 300 on the reception side may be included in the response signal RESP and transmitted to the semiconductor die 200 on the transmission side. When needed, the semiconductor die 200 on the transmission side may recover the response signal RESP using the ECC data, and the reliability of the response data included in the response signal RESP may be secured. Therefore, the accuracy and reliability of communication between the semiconductor die 200 on the transmission side and the semiconductor die 300 on the reception side may be improved, and the performance of the semiconductor device may be improved.

Figure 8:
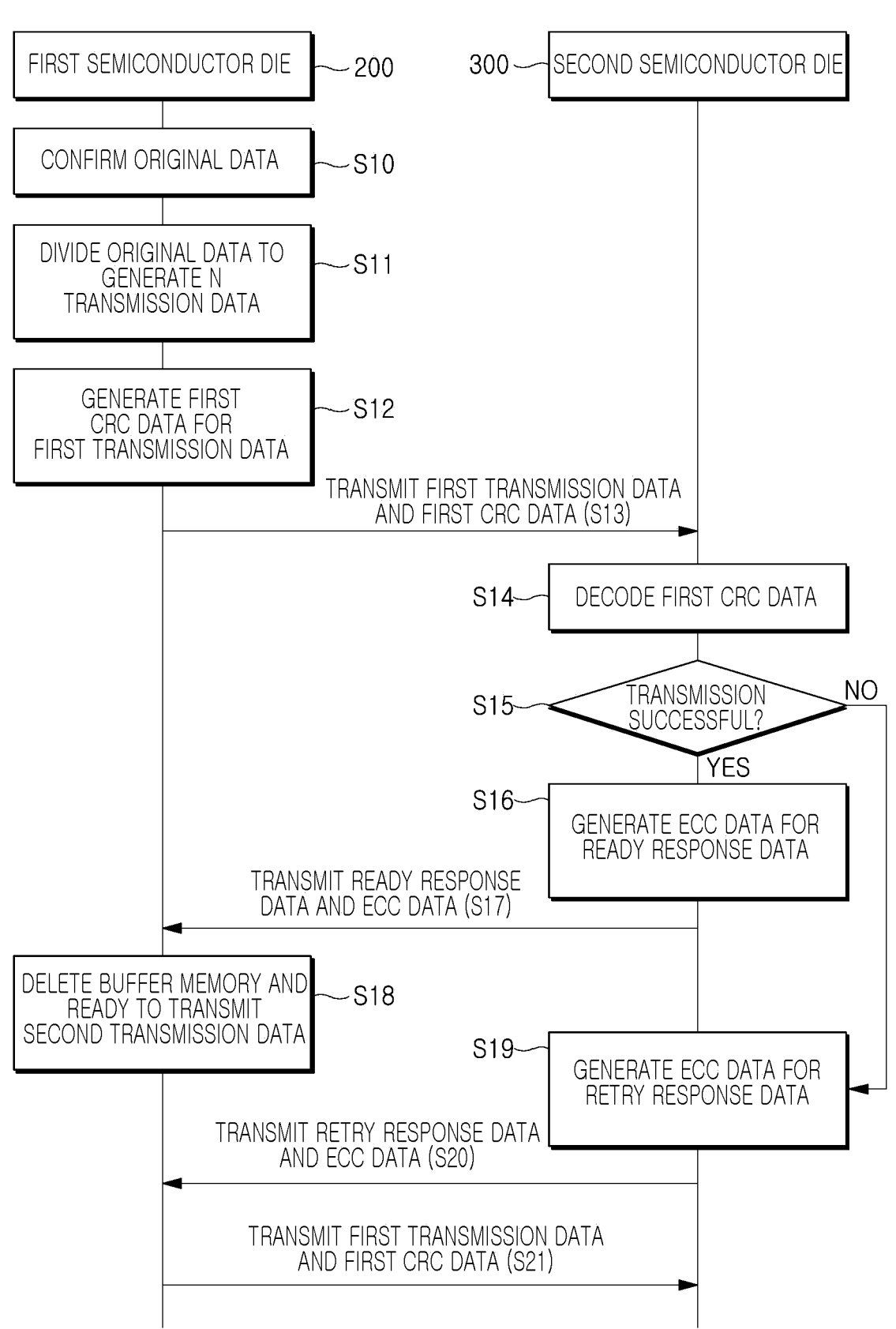
FIG. 8 is a diagram illustrating an operation of a semiconductor device according to one or more example embodiments of the disclosure.

FIG. 8 is a diagram illustrating an operation of a semiconductor device according to one or more example embodiments of the disclosure.

Referring to FIG. 8, a semiconductor device according to one or more example embodiments of the disclosure may include a first semiconductor die SD1 and a second semiconductor die SD2. The first semiconductor die SD1 may be a transmission side that is to transmit data, and the second semiconductor die SD2 may be a reception side that receives data. The first semiconductor die SD1 and the second semiconductor die SD2 may be stacked on each other in the semiconductor device and connected to each other by a plurality of via structures.

The first semiconductor die SD1 on the transmission side may confirm original data to be transmitted (S10). When the original data is confirmed, the first semiconductor die SD1 may divide the original data to generate N pieces of transmission data (S11) and store each of the N pieces of transmission data as one unit in the FIFO circuit. Each piece of transmission data stored in the FIFO circuit may be output at the same timing and input to the intermediate circuit of the first semiconductor die SD1, and the intermediate circuit may CRC-encode the transmission data to generate CRC data of the transmission data as described above.

Referring to FIG. 8, the first semiconductor die SD1 first may generate first CRC data for first transmission data (S12) and then transmit the first transmission data and the first CRC data to the second semiconductor die SD2. In an embodiment, the first semiconductor die SD1 may generate a first data signal including the first transmission data and the first CRC data and transmit the first data signal to the second semiconductor die SD2 along with a clock signal.

The second semiconductor die SD2 may decode the first CRC data included in the first data signal (S14) and determine whether transmission of the first transmission data has been successful based on the decoded first CRC data. (S15). For example, if it is determined that there is an error in the received first transmission data as a result of decoding the first CRC data, it may be determined that transmission of the first data has failed.

If it is determined that the transmission of the first transmission data is successful, the second semiconductor die SD2 may generate ready response data and ECC-encode the ready response data to generate ECC data for the ready response data (S16). The second semiconductor die SD2 may transmit a response signal including the ready response data and the ECC data to the first semiconductor die SD1 (S17), and in response thereto, the first semiconductor die SD1 may delete the first transmission data stored in a buffer memory and prepare transmission of second transmission data (S18).

If it is determined that the transmission of the first transmission data has failed, the second semiconductor die SD2 may generate retry response data and ECC-encode the retry response data to generate ECC data for the retry response data (S19). The second semiconductor die SD2 may transmit a response signal including the retry response data and the ECC data to the first semiconductor die SD1

(S20), and in response thereto, the first semiconductor die SD1 may re-CRC encode the first transmission data stored in the buffer memory to generate another first CRC data and retransmit a data signal including the first transmission data and the another first CRC data (S21).

When needed, the first semiconductor die SD1 may recover the ready response data or retry response data using the ECC data included in the response signal and execute a follow-up operation according to the transmission result of the data signal in operation S13. Accordingly, the accuracy and reliability of data communication between the first semiconductor die SD1 and the second semiconductor die SD2 may be improved.

Figure 9:
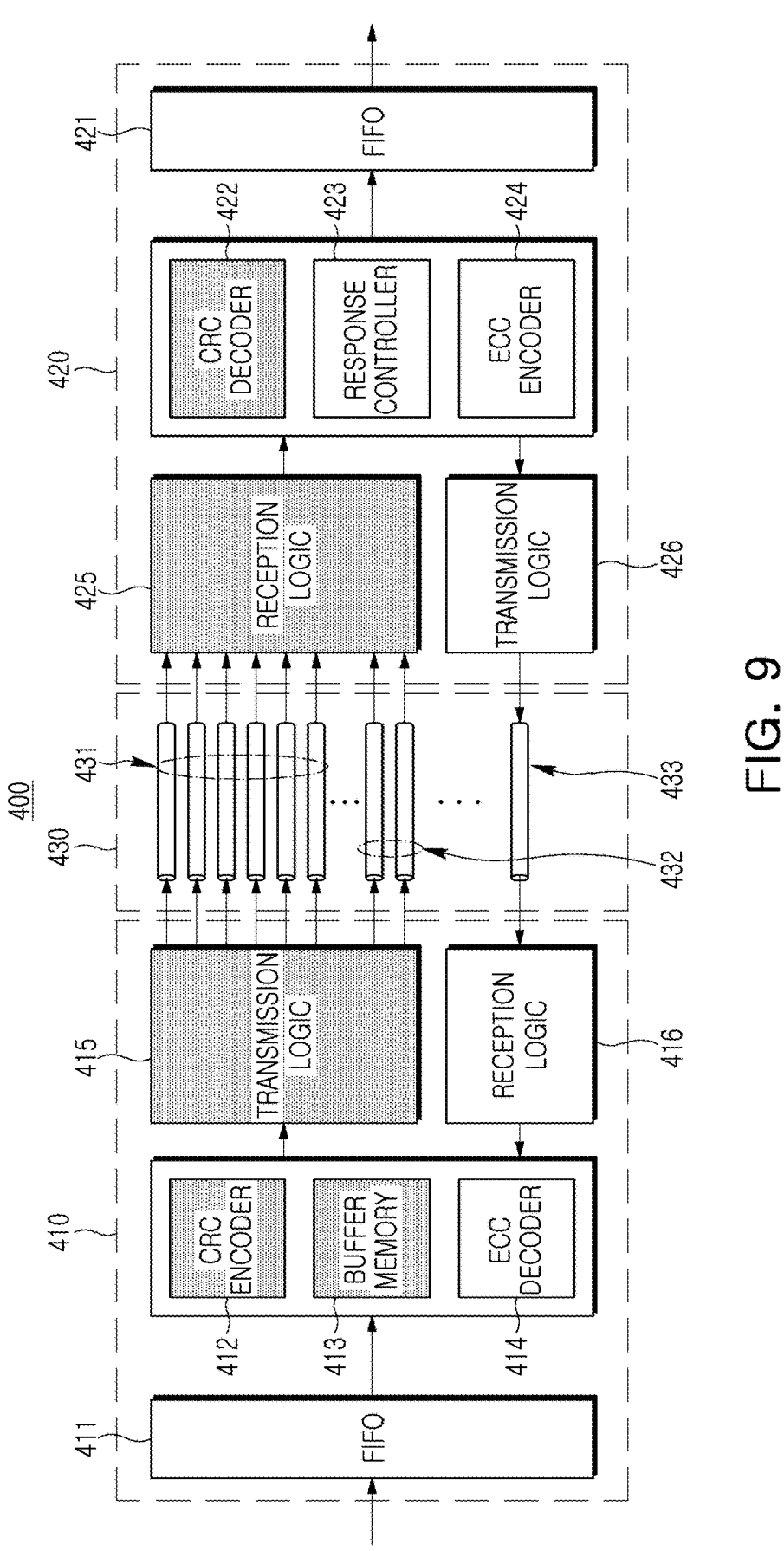
FIGS. 9 to 11 are diagrams illustrating operations of a semiconductor device according to one or more example embodiments of the disclosure.
Figure 10:
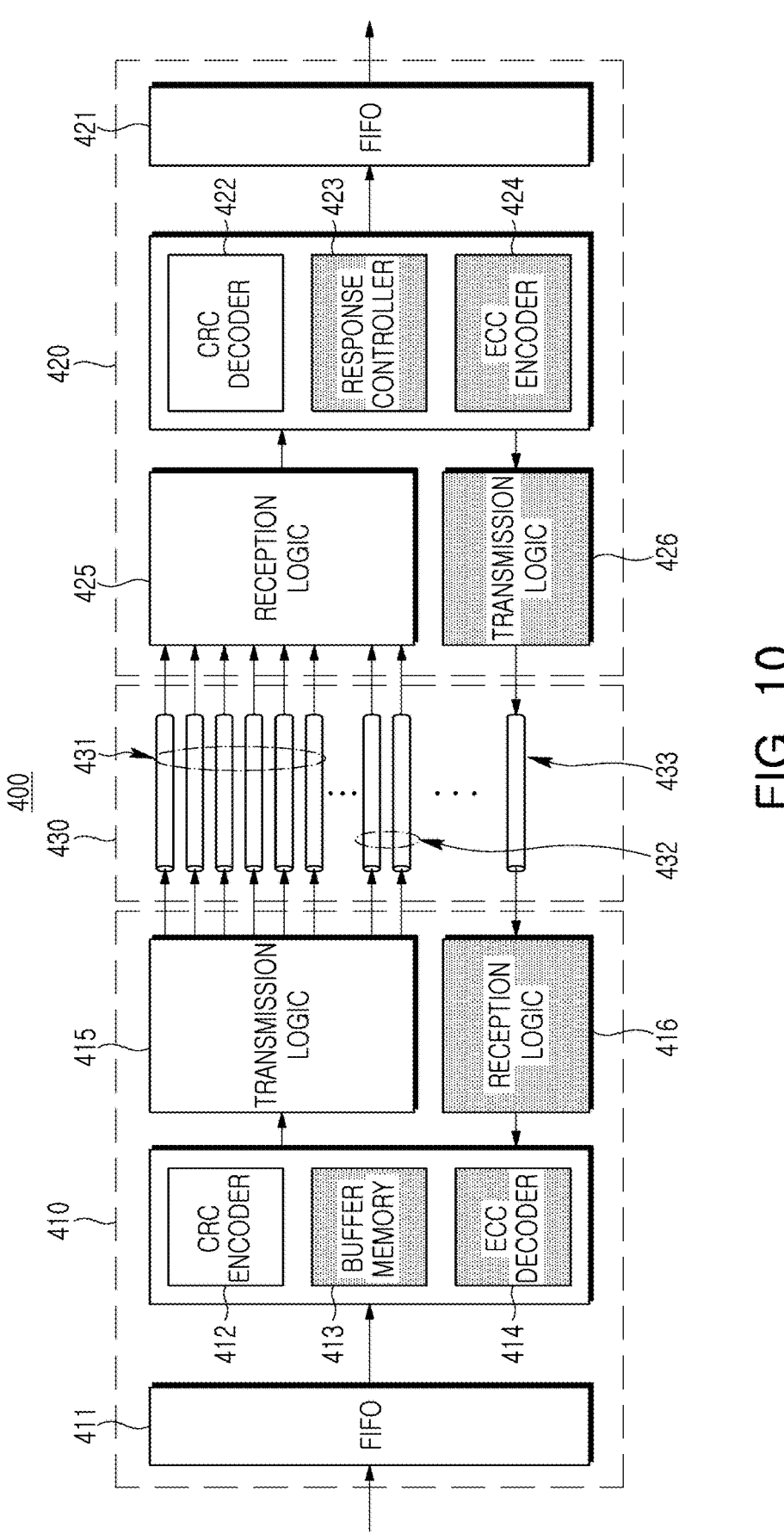
Figure 11:
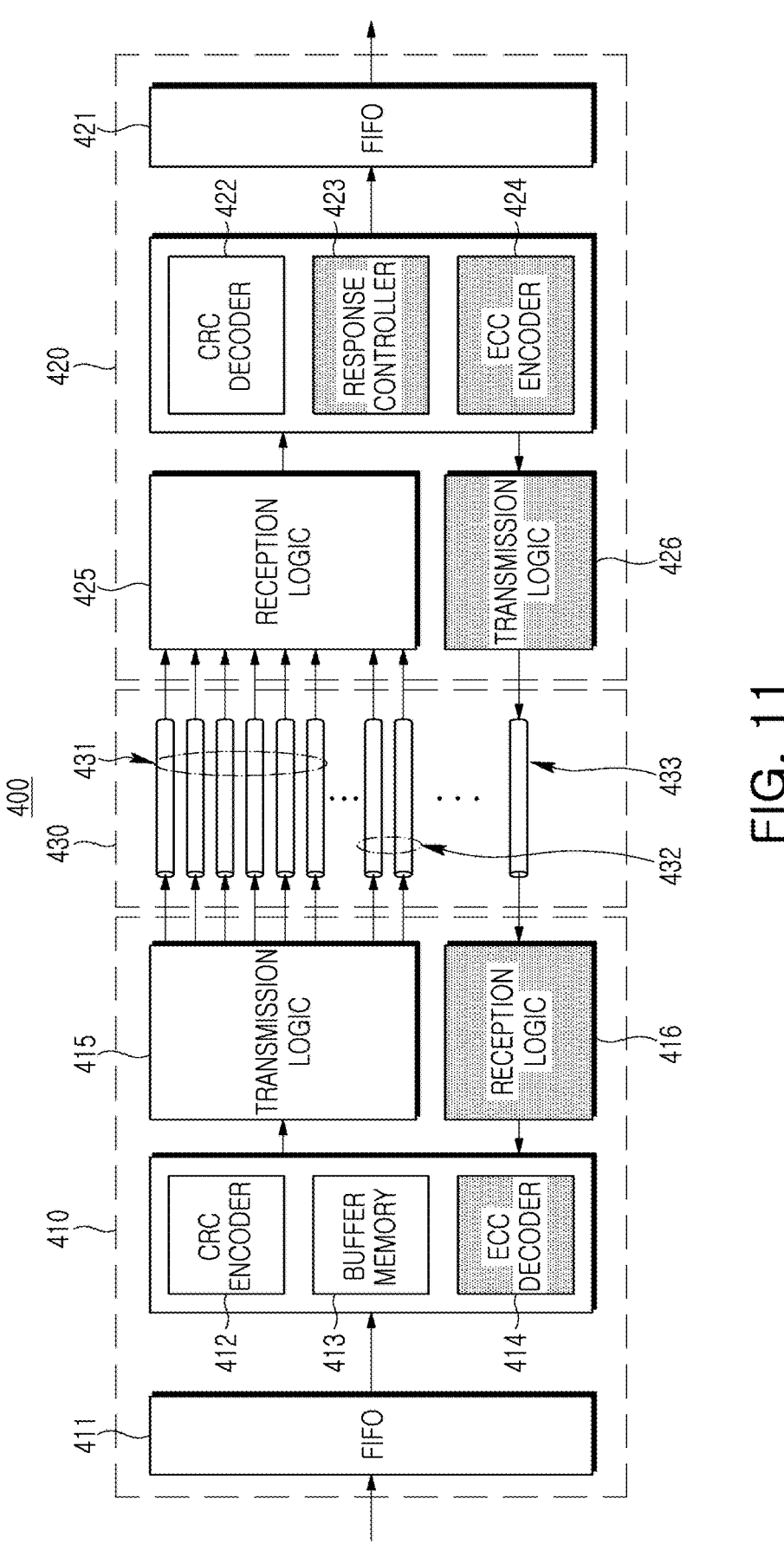

FIGS. 9 to 11 are diagrams illustrating operations of a semiconductor device according to one or more example embodiments of the disclosure.

FIGS. 9 to 11 may be diagrams illustrating an operation of a semiconductor device 400 including a first semiconductor die 410 and a second semiconductor die 420. The first semiconductor die 410 and the second semiconductor die 420 may be connected to each other by a plurality of via structures 430, and the plurality of via structures 430 may include data via structures 431, clock via structures 432 for transmitting a clock signal, and a response via structure(s) 433 for transmitting a response signal.

In the embodiment described with reference to FIGS. 9 to 11, the first semiconductor die 410 may be a transmission side, and the second semiconductor die 420 may be a reception side. Referring to FIG. 9, in the first semiconductor die 410, transmission data stored in a FIFO circuit 411 may be input to a CRC encoder 412 and stored in a buffer memory 413. The CRC encoder 412 may generate CRC data for transmission data, and the transmission data and the CRC data may be transmitted to a transmission logic 415.

The transmission logic 415 may transmit a data signal including transmission data and CRC data to the second semiconductor die 420 through the data via structures 431. The transmission logic 415 may transmit a clock signal to the second semiconductor die 420 through the clock via structures 432, and according to embodiments, clock signals having different frequencies may be transmitted to the second semiconductor die 420 through the clock via structures 432.

A reception logic 425 of the second semiconductor die 420 may receive a data signal and a clock signal and may be synchronized with the clock signal to extract transmission data included in the data signal. In the second semiconductor die 420, a CRC decoder 422 may extract CRC data included in the data signal, and a response controller 423 may determine whether the transmission data has been transmitted without an error based on the CRC data and generate response data according to a result of determination.

If it is determined that the transmission data has been transmitted without an error, the response controller 423 may generate, as the response data, ready response data informing the first semiconductor device 410 that the second semiconductor die 420 is ready to receive new transmission data. If the second semiconductor device 420 determines that an error has occurred in the received transmission data, the response controller 423 may generate, as the response data, retry response data requesting retransmission of the transmission data.

Referring to FIG. 10, the response data generated by the response controller 423 may be input to an ECC encoder 424 of the second semiconductor die 420 before being transmitted to the first semiconductor die 410 by a transmission logic 426 of the second semiconductor die 420. The ECC encoder 424 may generate ECC data for the response data, and the transmission logic 426 may transmit a response signal including the response data and the ECC data to the first semiconductor die 410 through the response via structure 433.

The response signal may be received by a reception logic 416 of the first semiconductor die 410. The response signal may be input to an ECC decoder 414, and the first semiconductor die 410 may determine a subsequent operation based on the response data. For example, if the response data is ready response data, the first semiconductor die 410 may delete the transmission data stored in the buffer memory 413 as illustrated in FIG. 11. Thereafter, new transmission data to be transmitted next may be transferred from the FIFO circuit 411 to the ECC encoder 412 and the buffer memory 413.

If the response data is re-request data, the transmission data stored in the buffer memory 413 may be transmitted again to the second semiconductor die 420, as described above with reference to FIG. 9. The transmission data stored in the buffer memory 413 may be again transmitted to the CRC encoder 412, and a data signal including CRC data, re-generated by the CRC encoder 412, and transmission data may be transmitted to the semiconductor die 420 by the transmission logic 415.

If an error occurs during transmission of the response data, the first semiconductor die 410 may recover the response data using the ECC data received along with the response data. Therefore, the reliability of the response data may increase, and the first semiconductor die 410 may resend transmission data that failed to be transmitted or send new transmission data by referring to the response data transmitted from the second semiconductor die 420.

Figure 12:
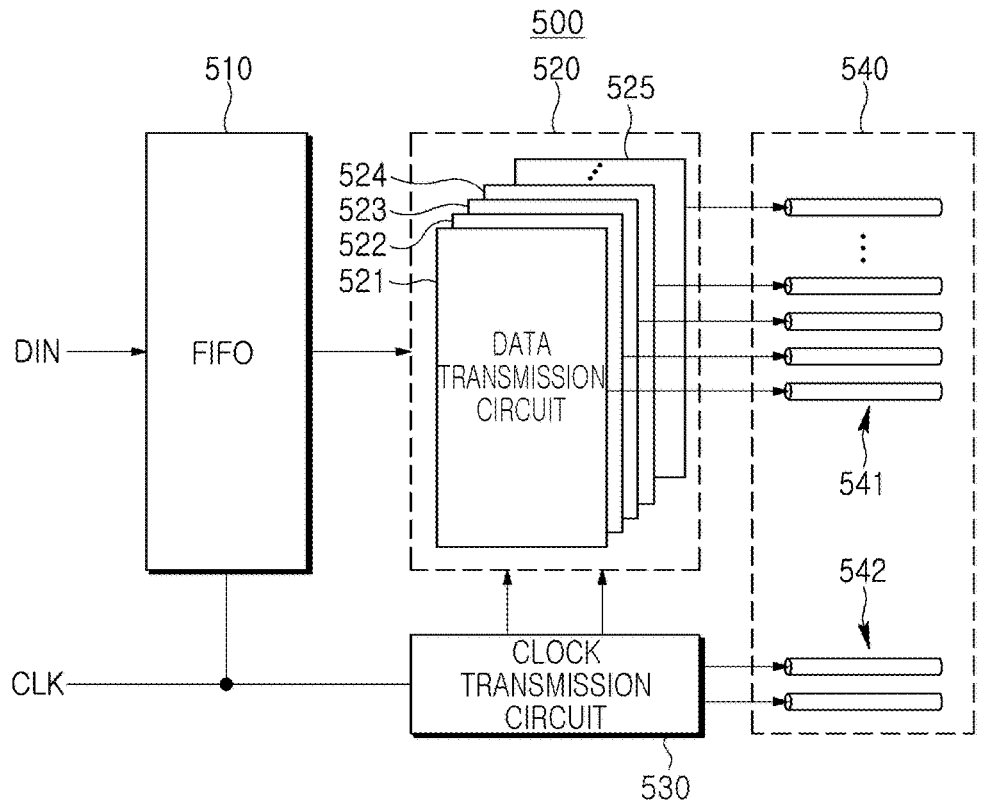
FIG. 12 is a diagram schematically illustrating a semiconductor device according to one or more example embodiments of the disclosure.

FIG. 12 is a diagram schematically illustrating a semiconductor device according to one or more example embodiments of the disclosure.

FIG. 12 may be a diagram schematically illustrating a portion of a semiconductor die 500 included in a semiconductor device according to one or more example embodiments of the disclosure. Referring to FIG. 12, the semiconductor die 500 may include a FIFO circuit 510, a plurality of data transmission circuits 521 to 525 (collectively, 520), a clock transmission circuit 530, and the like.

The plurality of data transmission circuits 521 to 525 (520) and the clock transmission circuit 530 may be included in an interface circuit. The plurality of data transmission circuits 520 may be connected to data via structures 541 arranged in a via region 540, and the clock transmission circuit 530 may be connected to clock via structures 542. The data via structures 541 may be connected to a plurality of data reception circuits included in the semiconductor die on the reception side. The plurality of data transmission circuits 520 may correspond to the data via structures 541, respectively. In an embodiment illustrated in FIG. 12, clock signals having different frequencies may be output through the clock via structures 542.

The semiconductor die 500 may include a clock generating circuit (not shown) configured to generate an internal clock signal CLK. For example, the clock generating circuit may include a phase locked loop circuit, a delay locked loop circuit, and the like. The FIFO circuit 510 may receive and store original data DIN to be transmitted to another semiconductor die from a core circuit within the semiconductor die 500 through a system bus or the like.

The FIFO circuit 510 may output at least a portion of the original data DIN as transmission data at a specific time with reference to the internal clock signal CLK. The transmission data may be input to the plurality of data transmission circuits 520, and each of the plurality of data transmission circuits 520 may include a latch and/or a flipflop capable of storing the transmission data by one bit at a time.

In addition, each of the plurality of data transmission circuits 520 may include a multiplexer configured to selectively output outputs from the latch and/or flipflop one by one. For example, a first data transmission circuit 521 may include a latch, a flipflop, and a multiplexer, and a total number of the latch and the flipflop may be two or more. The multiplexer may select the outputs from the latch and the flipflop one by one and transmit the same to one data via structure 541, such the first data transmission circuit 521 may be connected to one data via structure 541. By connecting one data via structure 541 to two or more of the latch and the flipflop using the multiplexer, a number of via structures arranged in the via region 540 may be appropriately limited and the integration of the semiconductor die 500 may be improved.

According to embodiments, an operation timing of the multiplexer may be determined by clock signals of different frequencies generated by the clock transmission circuit 530. Using the internal clock signal CLK, the clock transmission circuit 530 may generate a separate clock signal having a different frequency from the internal clock signal CLK and output the clock signals to the plurality of data transmission circuits 520 and the clock via structures 542.

Figure 13:
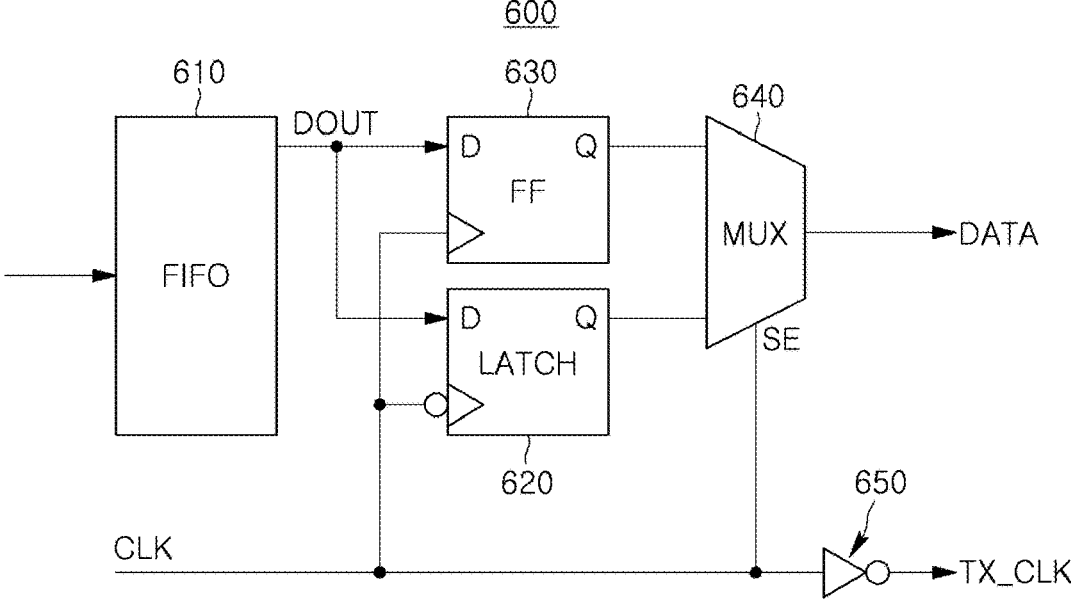
FIG. 13 is a diagram schematically illustrating an interface circuit included in a semiconductor device according to one or more example embodiments of the disclosure.
Figure 14:
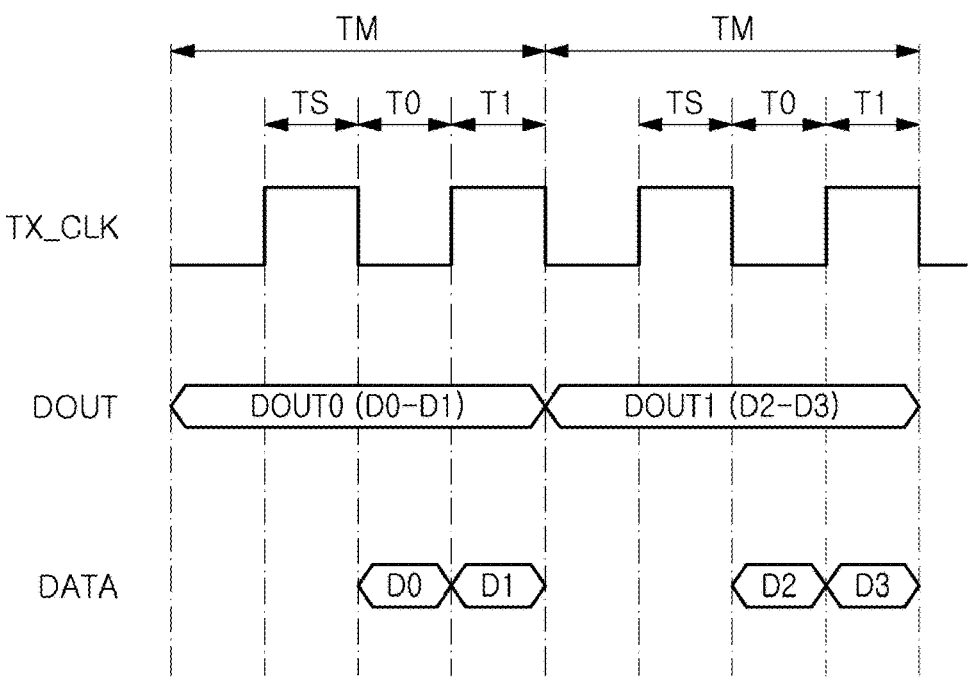
FIG. 14 is a diagram illustrating an operation of an interface circuit illustrated in FIG. 13.

FIG. 13 is a diagram schematically illustrating an interface circuit included in a semiconductor device according to one or more example embodiments of the disclosure. FIG. 14 is a diagram illustrating an operation of the interface circuit illustrated in FIG. 13. For example, the interface circuit illustrated in FIG. 13 may be included in the semiconductor die 500 illustrated in FIG. 12.

Referring to FIG. 13, an interface circuit 600 may include a FIFO circuit 610, a latch 620, a flipflop 630, a multiplexer 640, and an inverter 650. An output terminal of the multiplexer 640 may be connected to one data via structure, and an output terminal of the inverter 650 may be connected to a clock via structure different from the data via structure. The latch 620, the flipflop 630, and the multiplexer 640 may provide one of a plurality of data transmission circuits commonly connected to an output terminal of the FIFO circuit 610.

The FIFO circuit 610 may sequentially output transmission data DOUT to the latch 620 and the flipflop 630. The latch 620 and the flipflop 630 may operate in response to an internal clock signal CLK output by a clock generating circuit included in a semiconductor die together with the interface circuit 600 and store the transmission data DOUT output from the FIFO circuit 610. For example, the latch 620 and the flipflop 630 may store the transmission data DOUT by one bit at a time.

The multiplexer MUX may transmit an output of one of the latch 620 and the flipflop 630 as a data signal DATA in response to a selection signal SE. A transmission clock signal TX_CLK may be output by the inverter 650, and according to embodiments, a buffer circuit and the like may be added to a front portion and/or a rear portion of the inverter 650.

Referring to FIG. 14 together, the FIFO circuit 610 may maintain an output of the transmission data DOUT for a predetermined unit time TM. The predetermined unit time TM may be defined as a time in which a period of the internal clock signal CLK (or the transmission clock signal TX_CLK) is repeated a predetermined number of times. For example, the FIFO circuit 610 may maintain an output of first transmission data DOUT0 during a first unit time TM, and the first transmission data DOUT0 may be stored in the latch 620 and the flipflop 630 during a sampling time TS. For example, first data D0 included in the first transmission data DOUT0 may be stored in the latch 620, and second data D1 may be stored in the flipflop 630. Each of the first data D0 and the second data D1 may be 1-bit data.

The first data D0 and the second data D1 respectively stored in the latch 620 and the flipflop 630 may be selected by the multiplexer 640 at a first time T0 and a second time T1, respectively, and may be output as a data signal DATA through a data via structure. For example, the first time T0 may be a time at which the transmission clock signal TX_CLK has a low logic value corresponding to '0,' and the second time T1 may be a time at which the transmission clock signal TX_CLK has a high logic value corresponding to '1.'

The selection signal SE input to the multiplexer 640 may be the internal clock signal CLK, and when the selection signal SE is '0,' the multiplexer 640 may select the output from the latch 620, and when the selection signal SE is '1,' the multiplexer 640 may select the output from the flipflop 630. Therefore, as illustrated in FIG. 14, the first data D0 stored in the latch 620 for the first time T0 may be output as a data signal DATA, and the second data D1 stored in the flipflop 630 for the second time T1 may be output as a data signal DATA.

During a second unit time TM, the FIFO circuit 610 may maintain an output of second transmission data DOUT1, and during a sampling time TS, the second transmission data DOUT1 may be stored in each of the latch 620 and the flipflop 630 by one bit at a time. For example, during the sampling time TS of the second unit time TM, third data D2 may be stored in the latch 620 and fourth data D3 may be stored in the flipflop 630.

Similar to the first unit time TM, in the second unit time TM, the multiplexer 640 may output the output from the latch 620 to the data via structure during the first time T0 at which the transmission clock signal TX_CLK is '0' and output the output from the flipflop 630 to the data via structure during the second time T1 at which the transmission clock signal TX_CLK is '1.' Therefore, as illustrated in FIG. 14, the data signal DATA output to the data via structure may include third data D2 during the first time T0 and fourth data D3 during the second time T1.

As described above with reference to FIG. 13, a plurality of data transmission circuits may be commonly connected to one FIFO circuit 610. For example, a plurality of data transmission circuits may store transmission data output by the FIFO circuit 610 for a sampling time TS. A number of bits that may be stored in each of the plurality of data transmission circuits may be determined by a number of the latch 620 620 and the flipflop 630, and in an embodiment illustrated in FIG. 13, 2-bit data may be stored in one data transmission circuit. Accordingly, when the number of data transmission circuits connected to the FIFO circuit 610 is M, 2M bits of transmission data may be output through M data via structures per unit time TM.

Figure 15:
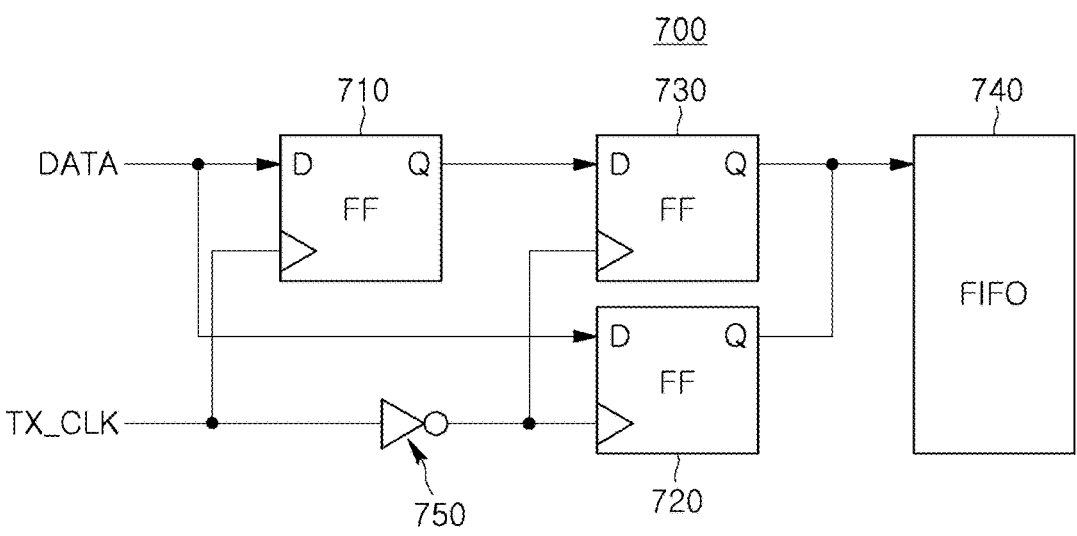
FIG. 15 is a diagram schematically illustrating an interface circuit included in a semiconductor device according to one or more example embodiments of the disclosure.

FIG. 15 is a diagram schematically illustrating an interface circuit included in a semiconductor device according to one or more example embodiments of the disclosure. For example, the interface circuit illustrated in FIG. 15 may be included in the semiconductor die 500 illustrated in FIG. 12.

Referring to FIG. 15, an interface circuit 700 may include a plurality of flipflops 710 to 730, a FIFO circuit 740, and an inverter 750. Input terminals of a first flipflop 710 and a second flipflop 720 may be connected to a data via structure that provide a transmission path for the data signal DATA, and an input terminal of the inverter 750 may be connected to a clock via structure that provides a transmission path of the transmission clock signal TX_CLK. The data via structure and the clock via structure may be connected to an interface circuit on a transmission side that outputs a data signal DATA and a transmission clock signal TX_CLK.

A first flipflop 710 may be synchronized with the transmission clock signal TX_CLK and store the data signal DATA output by an interface circuit on the transmission side. For example, the first flipflop 710 may be synchronized with a rising edge of the transmission clock signal TX_CLK and store the data signal DATA by one bit at a time. The transmission clock signal TX_CLK having a phase reversed by 180 degrees by the inverter 750 may be input to a second flipflop 720. Therefore, the second flipflop 720 may be synchronized with a falling edge of the transmission clock signal TX_CLK and store the data signal DATA by one bit at a time, and different data may be stored in the first flipflop 710 and the second flipflop 720.

Similar to the second flipflop 720, a third flipflop 730 may operate in synchronization with the transmission clock signal TX_CLK having a phase reversed by 180 degrees by the inverter 750. The FIFO circuit 740 may store data output by one bit at a time from each of the second flipflop 720 and the third flipflop 730 and may transmit the data to a core circuit included in the semiconductor die, or the interface circuit 700 adjacent to the core circuit. According to embodiments, the transmission clock signal TX_CLK having a phase reversed by 180 degrees by the inverter 750 may also be input to the FIFO circuit 740.

Figure 16:
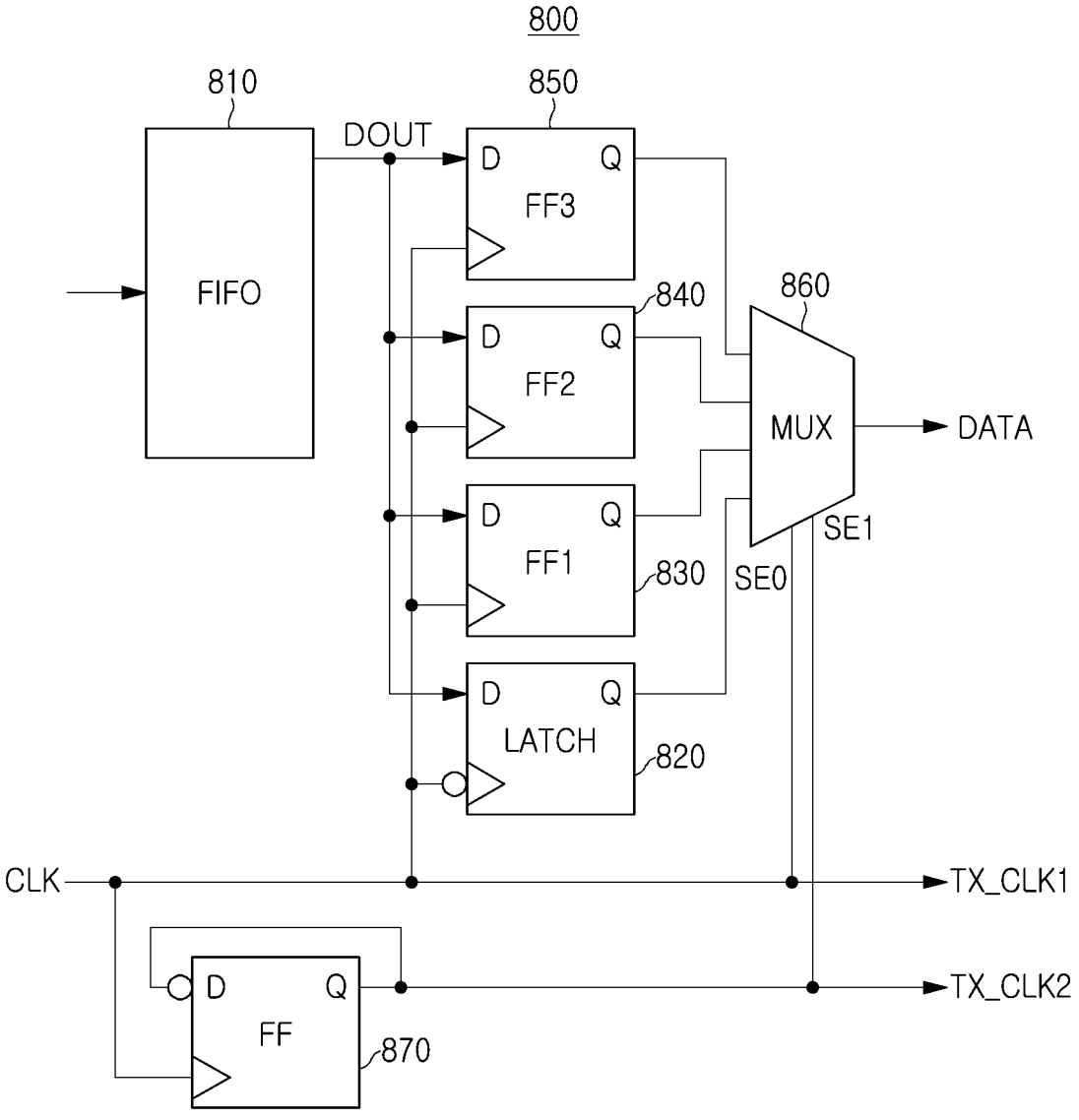
FIG. 16 is a diagram schematically illustrating an interface circuit included in a semiconductor device according to one or more example embodiments of the disclosure.
Figure 17:
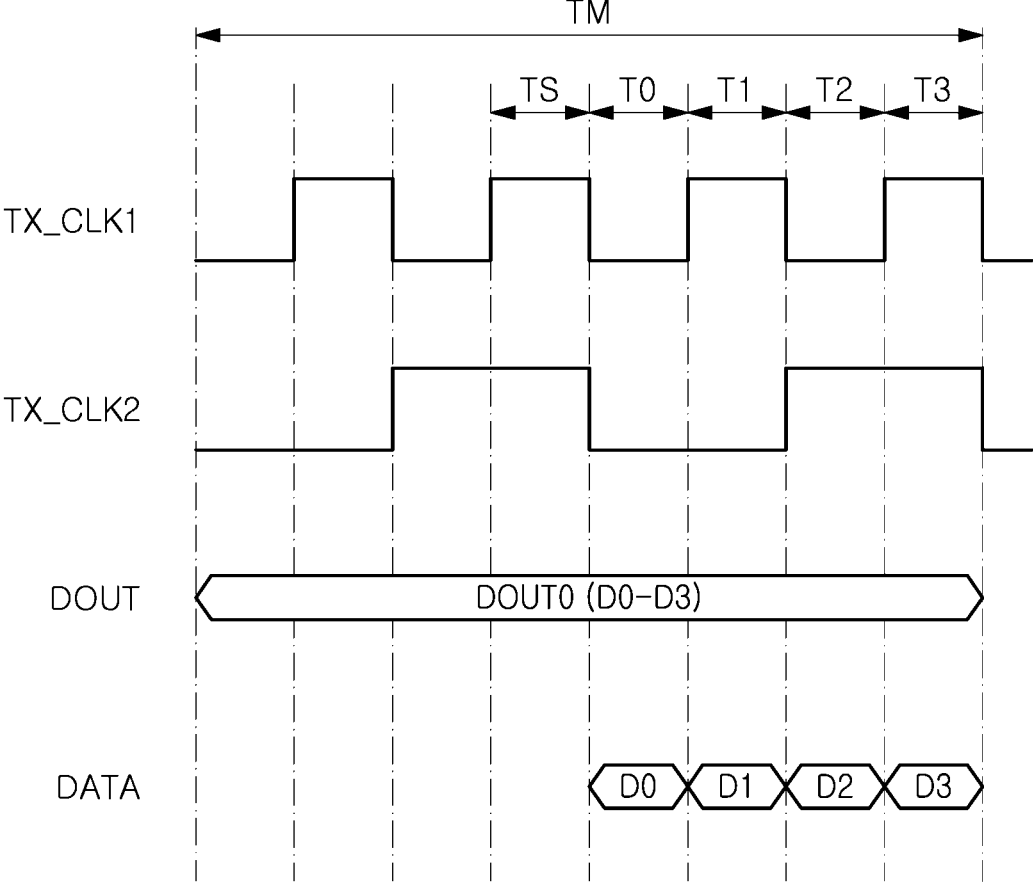
FIGS. 17 and 18 are diagrams illustrating an operation of the interface circuit illustrated in FIG. 16.
Figure 18:
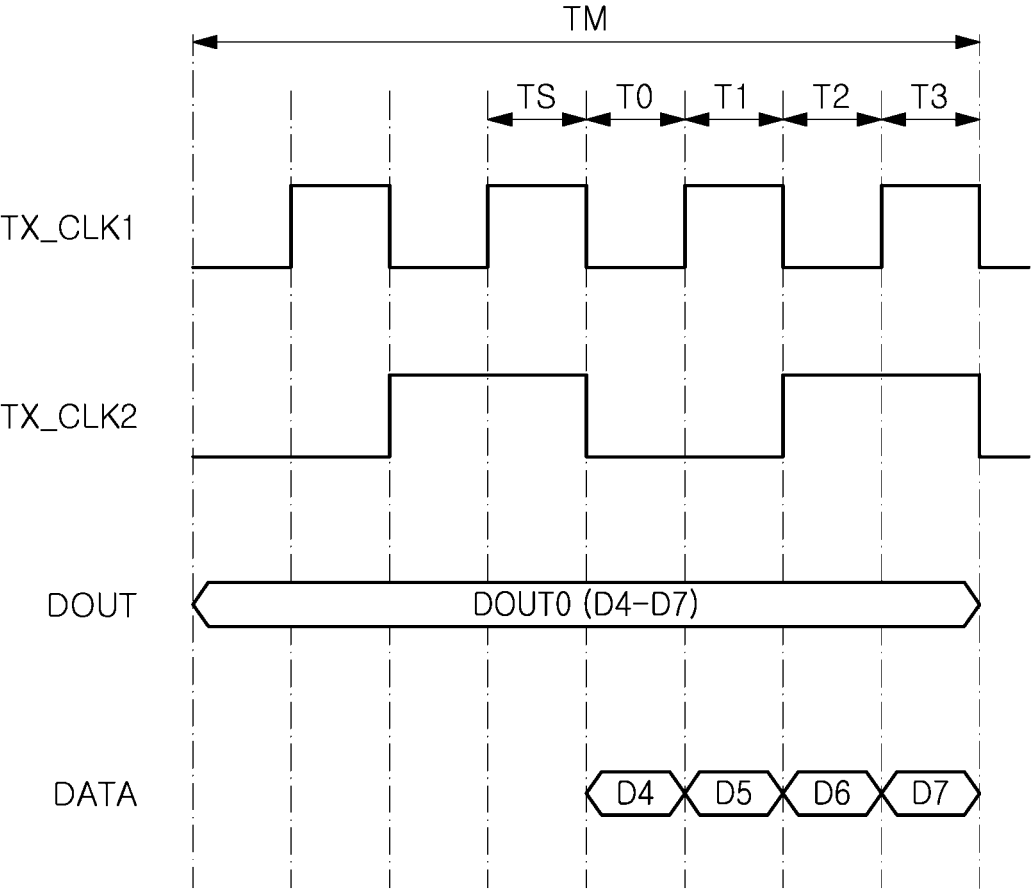

FIG. 16 is a diagram schematically illustrating an interface circuit included in a semiconductor device according to one or more example embodiments of the disclosure. FIGS. 17 and 18 are diagrams illustrating an operation of the interface circuit illustrated in FIG. 16. For example, the interface circuit illustrated in FIG. 16 may be included in the semiconductor die 500 illustrated in FIG. 12.

Referring to FIG. 16, an interface circuit 800 may include a FIFO circuit 810, a latch 820, first to third flipflops 830 to 850, a multiplexer 860, a clock flipflop 870, and the like. The latch 820, the first to third flipflops 830-850, and the multiplexer 860 may provide one of a plurality of data transmission circuits commonly connected to an output terminal of the FIFO circuit 810. An output terminal of the multiplexer 860 may be connected to a data via structure that outputs a data signal DATA.

In the interface circuit 800 according to the embodiment illustrated in FIG. 16, transmission data DOUT output by the FIFO circuit 810 may be input to the latch 820 and the first to third flipflops 830 to 850. The latch 820 and the flipflop 830 may operate in response to an internal clock signal CLK output by a clock generating circuit included in the semiconductor die together with the interface circuit 800 and store the transmission data DOUT output from the FIFO circuit 810. For example, the latch 820 and the flipflop 830 may store the transmission data DOUT by one bit at a time.

The multiplexer MUX may output an output from one of the latch 820 and the first to third flipflops 830 to 850 as a data signal DATA in response to selection signals SE0 and SE1. Since the signal to be selected by the multiplexer MUX is output by the latch 820 and the first to third flipflops 830 to 850, the multiplexer MUX may receive a 2-bit selection signal SE0 and SE1.

For example, a first selection signal SE0 may be determined by the internal clock signal CLK. The internal clock signal CLK may be a clock signal having a first frequency and may be output as a first transmission clock signal TX_CLK1 to another semiconductor die through a first clock via structure. A second selection signal SE1 may be determined by a second transmission clock signal TX_CLK2, which is a clock signal having a second frequency different from the first frequency.

The second transmission clock signal TX_CLK2 may be a signal generated by the clock flipflop 870. For example, the clock flipflop 870 may divide the frequency of the internal clock signal CLK by ½ times to output the second transmission clock signal TX_CLK2, and a value of the second selection signal SE1 input to the multiplexer 860 may be transmitted based on the second transmission clock signal TX_CLK2. Hereinafter, the operation of the interface circuit 800 is described with reference to FIGS. 17 and 18.

Referring to FIGS. 17 and 18 together, the FIFO circuit 810 may maintain an output of transmission data for a predetermined unit time TM, and the predetermined unit time TM may be defined as a time in which a period of the internal clock signal CLK is repeated by a predetermined number of times. Referring to FIG. 17, the FIFO circuit 810 may maintain an output of first transmission data DOUT0 for a first unit time TM, and the first transmission data DOUT0 may be stored in the latch 820 and the first to third flipflops 830 to 850 during a sampling time TS. For example, first data D0 included in the first transmission data DOUT0 may be stored in the latch 830, and second data D1 included in the first transmission data DOUT0 may be stored in the first flipflop 830. Third data D2 included in the first transmission data DOUT0 may be stored in the second flipflop 840, and fourth data D3 included in the first transmission data DOUT0 may be stored in the third flipflop 850. Each of the first to fourth data D0 to D3 may be 1-bit data.

The first to fourth data D0 to D3 stored in each of the latch 820 and the first to third flipflops 830 to 850 may be selected one by one by the multiplexer 640 during the first to fourth times T0 to T3 and may be output as a data signal DATA through the data via structure. For example, during the first time T0, the first transmission clock signal TX_CLK1 and the second transmission clock signal TX_CLK2 may have a low logic value corresponding to '0.' Accordingly, values of the first selection signal SE0 and the second selection signal SE1 to be input to the multiplexer 860 may be determined to be '00,' and an output from the latch 820 may be transmitted to the data via structure.

During the second time T1, the first transmission clock signal TX_CLK1 may have a low logic value corresponding to '0' and the second transmission clock signal TX_CLK2 may have a high logic value corresponding to '1.' Therefore, the values of the first selection signal SE0 and the second selection signal SE1 to input to the multiplexer 860 may be determined to be '01,' and an output from the first flipflop 830 may be transmitted to the data via structure. During the third time T2, the values of the first selection signal SE0 and the second selection signal SE1 to be input to the multiplexer 860 may be determined to be '10,' and an output of the second flipflop 840 may be transmitted to the data via structure, and during the fourth time T3, the values of the first selection signal SE0 and the second selection signal SE1 to be input to the multiplexer 860 may be determined to be '11,' and an output from the third flipflop 850 may be transmitted to the data via structure.

FIG. 18 may be a diagram illustrating an operation of the interface circuit 800 during a second unit time TM. Referring to FIG. 18, during the second unit time TM, the FIFO circuit 810 may maintain an output of second transmission data DOUT1, and during the sampling time TS, the second transmission time DOUT1 may be stored in each of the latch 820 and the first to third flipflops 830 to 850 by one bit at a time. For example, during the sampling time TS of the second unit time TM, fifth data D4 included in the second transmission time DOUT1 may be stored in the latch 820, and sixth data D5 included in the second transmission time DOUT1 may be stored in the first flipflop 830.

In the second unit time TM, the multiplexer 860 may sequentially transmit the output from each of the latch 820 and the first to third flipflops 830 to 850 to the data via structure in response to the selection signals SE0 and SE1 determined by the first transmission clock signal TX_CLK1 and the second transmission clock signal TX_CLK2. For example, the multiplexer 860 may connect the latch 820 to the data via structure during the first time T0 when the selection signals SE0 and SE1 are '00,' and may connect the first flipflop 830 to the data via structure during the second time T1 when the selection signals SE0 and SE1 are '01.'

A plurality of data transmission circuits may be commonly connected to one FIFO circuit 810, and the plurality of data transmission circuits may store transmission data output from the FIFO circuit 810 during the sampling time TS. The number of bits that may be stored in each of the plurality of data transmission circuits may be determined depending on a number of the latch 820 and the flipflops 830-850. For example, in the embodiment illustrated in FIG. 16, 4 bits of data may be stored in one data transmission circuit at a time.

For example, assuming that the number of data via structures outputting the data signal DATA is M, the number of data transmission circuits may also be M. In this case, the FIFO circuit 810 may output 4M bits of transmission data at a time, and each of the latch 820 and flipflops 830 to 850 included in each of the data transmission circuits may store the transmission data by one bit at a time. By using the multiplexers 860 included in the data transmission circuits, M bits of transmission data may be output to a semiconductor die on the reception side through M data via structures in synchronization with the first transmission clock signal TX_CLK1 and the second transmission clock signal TX_CLK2.

According to embodiments, the number of bits stored at a time in each of the data transmission circuits may be more than 4 bits. For example, the total number of latch(es) and flipflop(s) included in a single data transmission circuit may be 8, and 8 bits of transmission data may be stored in a single data transmission circuit at a time. In this case, a first clock signal having a frequency of ½ times the frequency of the internal clock signal and a second clock signal having a frequency of ¼ times the frequency of the internal clock signal may be generated, and the data stored in eight latch(es) and flipflop(s) may be sequentially output by controlling the multiplexer with three clock signals including the internal clock signal, the first clock signal, and the second clock signal. In this manner, by increasing the number of bits stored at a time in each of the data transmission circuits, the number of data via structures required to transmit transmission data of the same size may be reduced.

Figure 19:
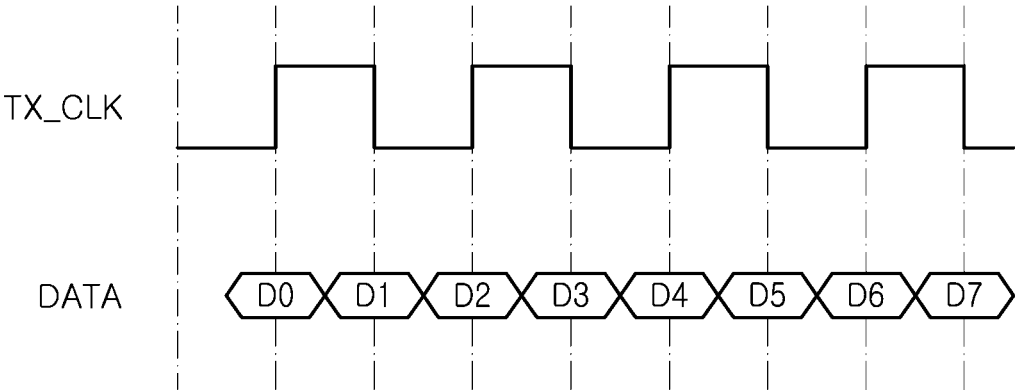
FIGS. 19 and 20 are diagrams illustrating an operation of a semiconductor device according to one or more example embodiments of the disclosure.
Figure 20:
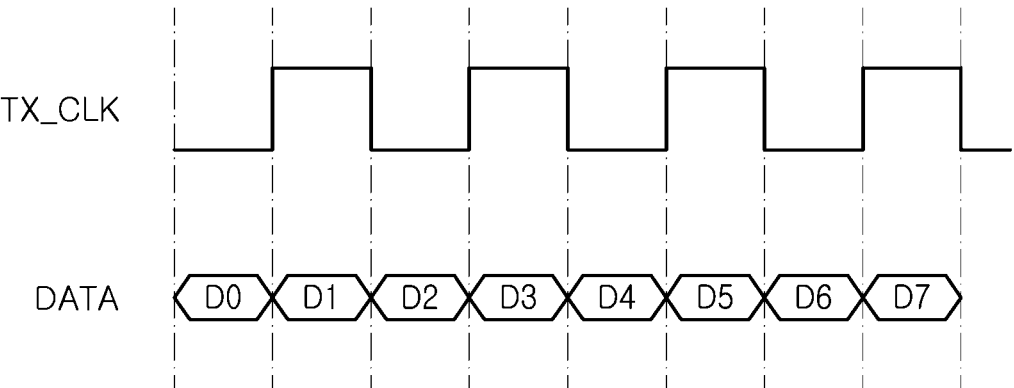

FIGS. 19 and 20 are diagrams illustrating an operation of a semiconductor device according to one or more example embodiments of the disclosure.

FIGS. 19 and 20 may be diagrams illustrating a data signal DATA and a transmission clock TX_CLK transmitted between semiconductor dies included in a semiconductor device according to one or more example embodiments of the disclosure. In an embodiment illustrated in FIGS. 19 and 20, the data signal DATA may be a signal output through a single data via structure.

Referring to FIG. 19, the data signal DATA may be output in synchronization with an edge of the transmission clock signal TX_CLK. For example, the data signal DATA may be transmitted in a double data rate (DDR) method in which individual data D0 to D7 is output at each rising edge and falling edge of the transmission clock signal TX_CLK. Therefore, a larger amount of data may be transmitted and received in a given period of time, and the rising edge or the falling edge of the transmission clock signal TX_CLK may be aligned with a center of the individual data D0 to D7 such that a set-up time margin of the flipflop included in the interface circuit on the reception side may be sufficiently secured.

In the embodiment illustrated in FIG. 20, an edge between the individual data D0 to D7 included in the data signal DATA may be aligned with the rising edge or falling edge of the transmission clock signal TX_CLK and transmitted. In the embodiment illustrated in FIG. 20, the interface circuit on the reception side may include a delay circuit that receives the transmission clock signal TX_CLK. The delay circuit may adjust a phase of the transmission clock signal TX_CLK to ensure a sufficient setup time margin in the flipflop that receives the data signal DATA and then input the phase-adjusted transmission clock signal TX_CLK to the flipflop. For example, an appropriate delay value required for alignment of the transmission clock signal TX_CLK and the data signal DATA may vary depending on the characteristics of a semiconductor die and a semiconductor device including the semiconductor die. Accordingly, the delay value for adjusting the phase of the transmission clock signal TX_CLK by the delay circuit may be determined in a test process of the semiconductor device.

According to one or more example embodiments of the disclosure, in communication between semiconductor dies that are stacked on each other to provide a single semiconductor device, the transmission side may transmit a data signal including transmission data and an error detection code of the transmission data, and the reception side may determine whether the transmission data has been normally (or successfully) transmitted by decoding the error detection code, and determine whether to request retransmission of the data signal. Therefore, communication reliability between the semiconductor dies may be improved. In addition, power consumption may be reduced by implementing the transmission and reception circuits with digital circuits including flipflops, latches, multiplexers, and the like, without analog physical circuits.

While example embodiments have been illustrated and described above, it will be apparent to those skilled in the art that modifications and variations could be made without departing from the scope of the disclosure as defined by the appended claims and their equivalents.

What is claimed is:

1. A semiconductor device comprising:
a first semiconductor die including a first interface circuit configured to output a data signal and a transmission clock signal, wherein the first interface circuit includes a cyclic redundancy check (CRC) encoder configured to generate CRC data of transmission data included in the data signal and a buffer memory configured to store the transmission data;
a second semiconductor die including a second interface circuit configured to receive the data signal and the transmission clock signal, wherein the second interface circuit includes a CRC decoder configured to decode the CRC data included in the data signal, a response controller configured to generate response data based on the CRC data, the response data indicating completion of transmission of the transmission data or requesting retransmission of the transmission data, and an error correcting code (ECC) encoder configured to generate ECC data of the response data; and
a plurality of via structures connecting the first interface circuit to the second interface circuit,
wherein the first interface circuit further includes an ECC decoder configured to recover the response data by decoding the ECC data of the response data, and based on the response data, retransmit the transmission data stored in the buffer memory or transmit new transmission data.

2. The semiconductor device of claim 1, wherein the first semiconductor die provides a processor, and the second semiconductor die provides a memory.

3. The semiconductor device of claim 1, wherein the first semiconductor die includes a first semiconductor substrate, and the second semiconductor die includes a second semiconductor substrate, and
wherein each of the plurality of via structures is a through-silicon via that penetrates through at least one of the first semiconductor substrate or the second semiconductor substrate.

4. The semiconductor device of claim 1, wherein the first semiconductor die includes a first core circuit connected to the first interface circuit through a first system bus, and
wherein the second semiconductor die includes a second core circuit connected to the second interface circuit through a second system bus.

5. The semiconductor device of claim 1, wherein the first interface circuit includes a first-in-first-out (FIFO) circuit configured to store the data signal and a plurality of data transmission circuits commonly connected to an output terminal of the FIFO circuit.

6. The semiconductor device of claim 5, wherein each of the plurality of data transmission circuits includes a latch and at least one flipflop, each of which being configured to receive the data signal from the FIFO circuit, and a multiplexer configured to connect one of the latch and the at least one flipflop to a corresponding via structure among the plurality of via structures.

7. The semiconductor device of claim 6, wherein the latch and the at least one flipflop are synchronized with an internal clock signal, input to the first interface circuit, to store the data signal at a predetermined time, and the multiplexer is configured to sequentially connect the latch and the at least one flipflop to the corresponding via structure.

8. The semiconductor device of claim 6, wherein the first interface circuit includes a clock flipflop configured to divide a frequency of an internal clock signal,
wherein the transmission clock signal includes a first transmission clock signal having a same frequency as a frequency of the internal clock signal, and a second transmission clock signal output from the clock flipflop, and
wherein the multiplexer is configured to receive the first transmission clock signal and the second transmission clock signal.

9. The semiconductor device of claim 5, wherein the plurality of via structures include a plurality of data via structures that provide a transmission path for the data signal, and a number of the plurality of data via structures is equal to a number of the plurality of data transmission circuits.

10. The semiconductor device of claim 1, wherein the second interface circuit includes a plurality of data reception circuits, each being configured to receive the data signal from the first interface circuit and receive the transmission clock signal from the first interface circuit through at least one clock via structure among the plurality of via structures, and wherein each of the plurality of data reception circuits includes a first flipflop and a second flipflop, connected to a corresponding via structure among the plurality of via structures, and a third flipflop connected to the first flipflop.

11. The semiconductor device of claim 10, wherein the first flipflop is configured to store the data signal in response to a rising edge of the transmission clock signal, and the second flipflop and the third flipflop are configured to store the data signal in response to a falling edge of the transmission clock signal.

12. The semiconductor device of claim 11, wherein the second interface circuit includes an inverter configured to invert the transmission clock signal and transmit the inverted transmission clock signal to the second flipflop and the third flipflop.

13. The semiconductor device of claim 11, wherein the second interface circuit is connected to a clock via structure, among the plurality of via structures, through which the transmission clock signal is transmitted, and includes a delay circuit configured to adjust a phase of the transmission clock signal.

14. The semiconductor device of claim 1, wherein the first interface circuit is configured to, based on the response data indicating the completion of transmission of the transmission data, delete the transmission data stored in the buffer memory.

15. The semiconductor device of claim 1, wherein the first interface circuit is configured to, based on the response data requesting the retransmission of the transmission data, retransmit the data signal including the transmission data stored in the buffer memory to the second interface circuit.

16. A semiconductor device comprising:
a first semiconductor die including a first interface circuit; and
a second semiconductor die stacked with the first semiconductor die and including a second interface circuit, the second interface circuit being connected to the first semiconductor die by a plurality of via structures, wherein the first interface circuit is configured to generate an error detection code for transmission data and transmit a data signal including the transmission data and the error detection code to the second interface circuit through at least some of the plurality of via structures, and wherein the second interface circuit is configured to generate response data, indicating whether the data signal is normally received, and an error correction code of the response data, and transmit a response signal including the response data and the error correction code to the first interface circuit through at least one via structure among the plurality of via structures.

17. The semiconductor device of claim 16, wherein, based on an error being detected from the transmission data included in the data signal based on the error detection code, the second interface circuit is configured to generate the response data requesting retransmission of the transmission data.

18. The semiconductor device of claim 17, wherein the first interface circuit is configured to correct an error in the response data by using the error correction code, and determine whether to retransmit the transmission data based on the response data of which error has been corrected.

19. The semiconductor device of claim 16, wherein the at least some of the plurality of via structures through which the data signal and the error detection code are transmitted is different from the at least one via structure through which the response signal is transmitted.

20. A semiconductor device comprising:
a first semiconductor die including a first interface circuit; and
a second semiconductor die including a second interface circuit connected to the first interface circuit by a plurality of via structures, the second semiconductor die being stacked with the first semiconductor die,
wherein the first interface circuit includes a plurality of data transmission circuits connected to data via structures among the plurality of via structures and a first-in-first-out (FIFO) circuit commonly connected to the plurality of data transmission circuits, and
wherein each of the plurality of data transmission circuits includes a latch and at least one flipflop, each being configured to receive transmission data output from the FIFO circuit, and a multiplexer connected between the latch and the at least one flipflop and a corresponding data via structure among the data via structures.

* * * * *